(12) United States Patent
Petersen

(10) Patent No.: US 11,982,581 B2
(45) Date of Patent: May 14, 2024

(54) SURFACE ELEMENT

(71) Applicant: Parador GmbH, Coesfeld (DE)

(72) Inventor: Frank Petersen, Coesfeld (DE)

(73) Assignee: Parador GmbH, Coesfeld (DE)

( * ) Notice: Subject to any disclaimer, the term of this patent is extended or adjusted under 35 U.S.C. 154(b) by 533 days.

(21) Appl. No.: 17/279,882

(22) PCT Filed: Jan. 27, 2020

(86) PCT No.: PCT/EP2020/051913
§ 371 (c)(1),
(2) Date: Mar. 25, 2021

(87) PCT Pub. No.: WO2020/156997
PCT Pub. Date: Aug. 6, 2020

(65) Prior Publication Data
US 2022/0034729 A1    Feb. 3, 2022

(30) Foreign Application Priority Data

Jan. 28, 2019  (DE) ...................... 10 2019 000 561.9
Apr. 25, 2019  (DE) ...................... 10 2019 110 650.8

(51) Int. Cl.
*B32B 5/18*     (2006.01)
*B32B 3/04*     (2006.01)
(Continued)

(52) U.S. Cl.
CPC ................ *G01L 1/146* (2013.01); *B32B 3/04* (2013.01); *B32B 3/06* (2013.01); *B32B 5/18* (2013.01);
(Continued)

(58) Field of Classification Search
CPC .. G01L 1/146; B32B 3/04; B32B 3/06; B32B 5/18; B32B 21/08; B32B 27/10;
(Continued)

(56) References Cited

U.S. PATENT DOCUMENTS 10,960,643 B2 *   3/2021  Harrison .................. E04B 7/20
2016/0217664 A1 *  7/2016  Bradford ................. H04Q 9/00

FOREIGN PATENT DOCUMENTS

CA        2255988 A1      9/1999
EP        940518 A1 *     9/1999  ............ E04C 2/292
(Continued)

OTHER PUBLICATIONS

International Search Report for International Application No. PCT/EP2020/051913, dated Apr. 22, 2020.
(Continued)

*Primary Examiner* — Jamel E Williams
(74) *Attorney, Agent, or Firm* — Jason H. Vick; Sheridan Ross, PC

(57) ABSTRACT

The invention relates to a surface element (1), intended for use as a floor, wall and/or ceiling surface element for a floor, wall and/or ceiling covering, having at least one carrier plate (2) and at least one functional layer (3), wherein the carrier plate (2) comprises a top side (5) facing a usable side (4) and an underside (7) opposite the top side (5) and facing the underground (6). According to the invention, it is provided that the functional layer (3) is provided underneath the carrier plate (2), and that the functional layer (3) is designed in such a way that, in the installed state, it projects beyond the side edge (10) of the side (8), in particular of the long side (9), on at least one side (8), especially on at least one long side (9).

18 Claims, 17 Drawing Sheets

Figure 1:
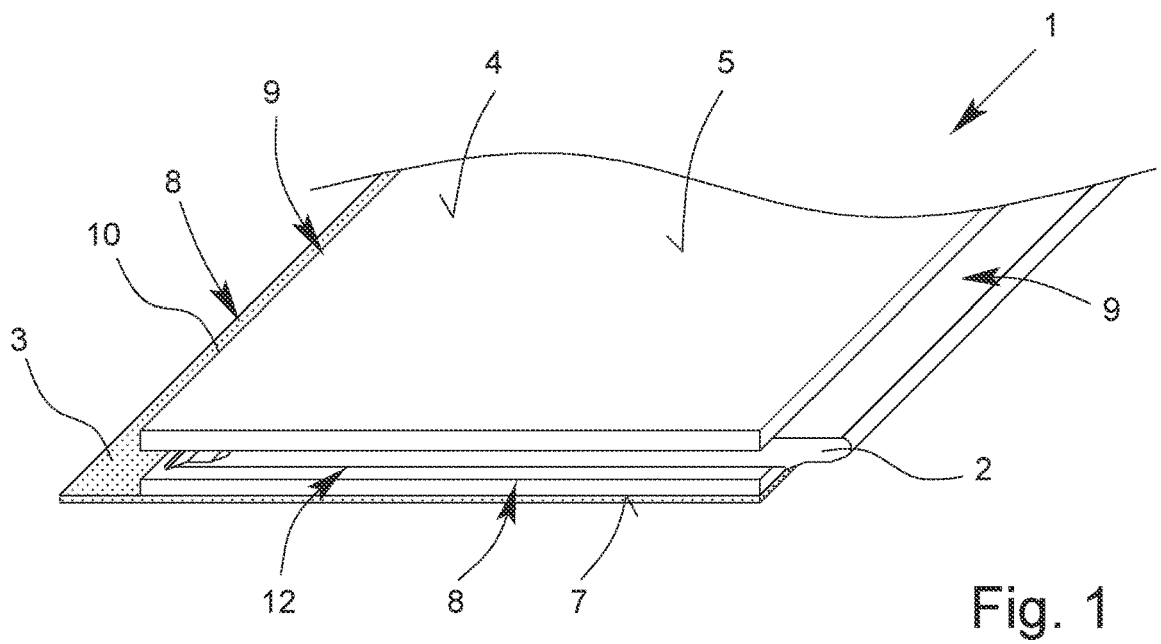

(51) Int. Cl.
| | |
|---|---|
| *B32B 3/06* | (2006.01) |
| *B32B 21/04* | (2006.01) |
| *B32B 21/08* | (2006.01) |
| *B32B 27/10* | (2006.01) |
| *B32B 29/00* | (2006.01) |
| *E04F 13/08* | (2006.01) |
| *E04F 15/02* | (2006.01) |
| *E04F 15/10* | (2006.01) |
| *G01K 7/34* | (2006.01) |
| *G01L 1/14* | (2006.01) |
| *G01N 27/22* | (2006.01) |
| *H01F 38/14* | (2006.01) |
| *H01R 12/78* | (2011.01) |
| *H05K 1/14* | (2006.01) |

(52) U.S. Cl.
CPC ............ *B32B 21/047* (2013.01); *B32B 21/08* (2013.01); *B32B 27/10* (2013.01); *B32B 29/007* (2013.01); *E04F 13/0866* (2013.01); *E04F 13/0894* (2013.01); *E04F 15/02038* (2013.01); *E04F 15/107* (2013.01); *G01K 7/34* (2013.01); *G01N 27/223* (2013.01); *H01F 38/14* (2013.01); *H01R 12/78* (2013.01); *H05K 1/147* (2013.01); *B32B 2255/08* (2013.01); *B32B 2307/202* (2013.01); *B32B 2471/00* (2013.01); *B32B 2607/00* (2013.01); *E04F 2201/0115* (2013.01); *E04F 2201/023* (2013.01); *E04F 2201/043* (2013.01); *E04F 2290/02* (2013.01)

(58) Field of Classification Search
CPC .......... G01K 7/34; H01F 38/14; H01R 12/78; H05K 1/147
See application file for complete search history.

(56) References Cited

FOREIGN PATENT DOCUMENTS

| | | |
|---|---|---|
| EP | 0940518 A1 | 9/1999 |
| FR | 2637932 A1 | 4/1990 |
| WO | WO 2005/049937 | 6/2005 |

OTHER PUBLICATIONS

Written Opinion for International Application No. PCT/EP2020/051913, dated Apr. 22, 2020.
International Preliminary Report on Patentability for International Application No. PCT/EP2020/051913, dated Aug. 12, 2021.

\* cited by examiner

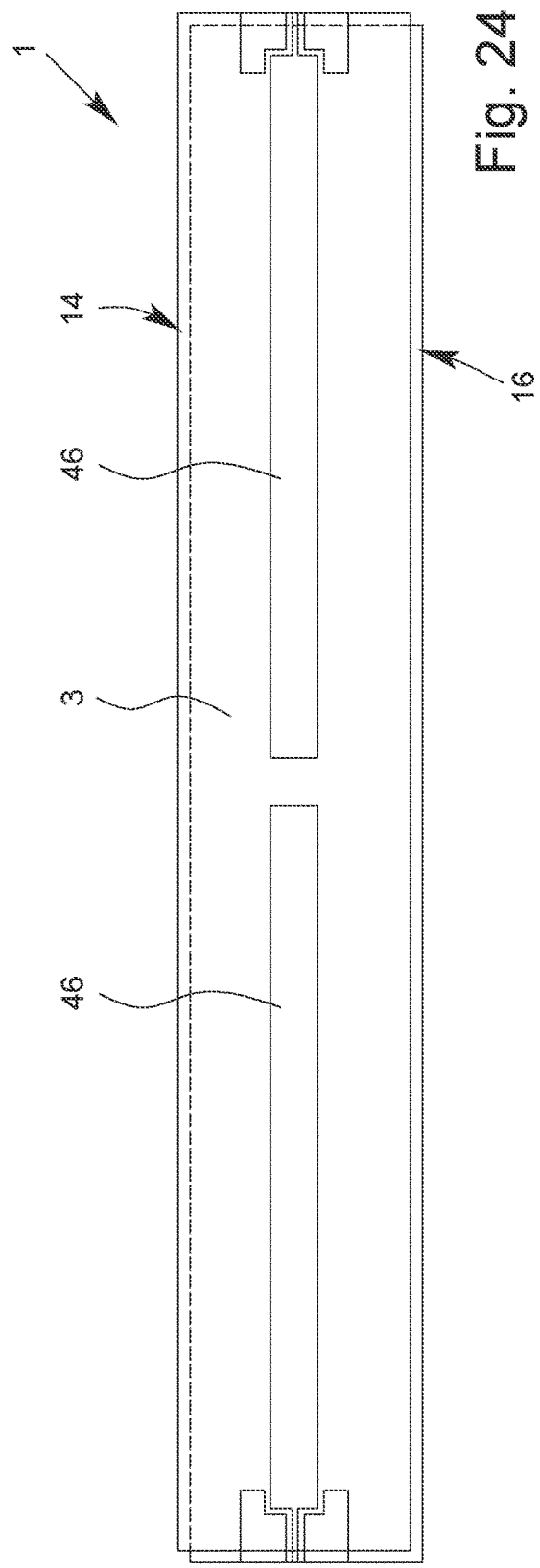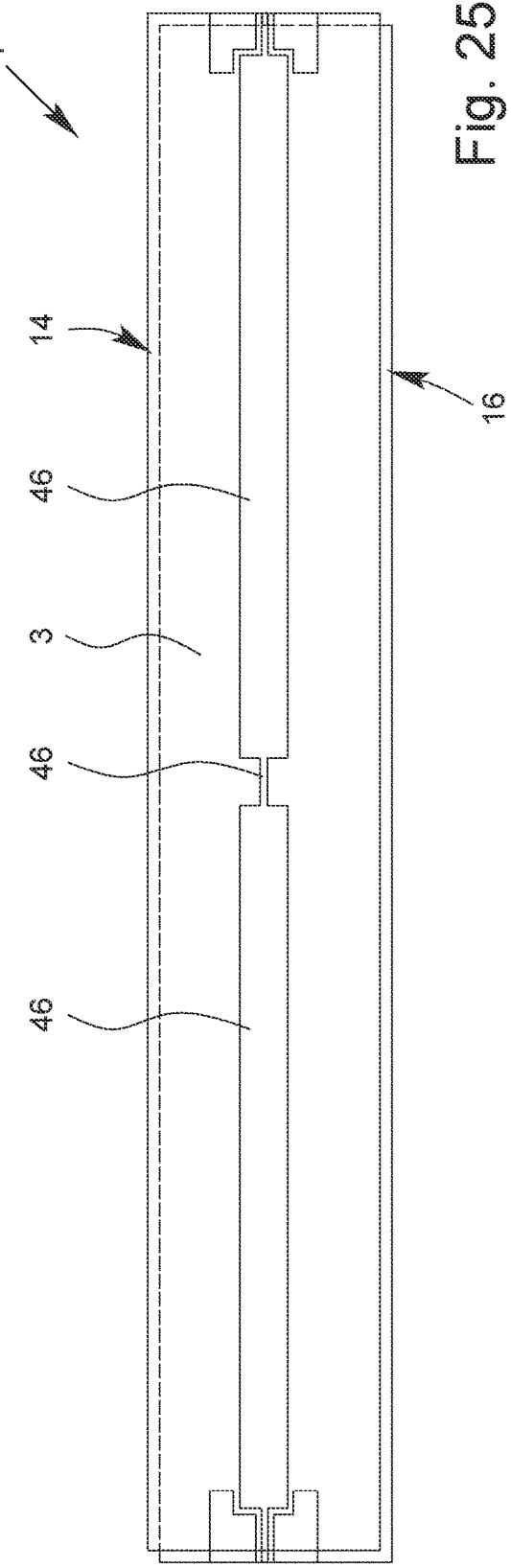

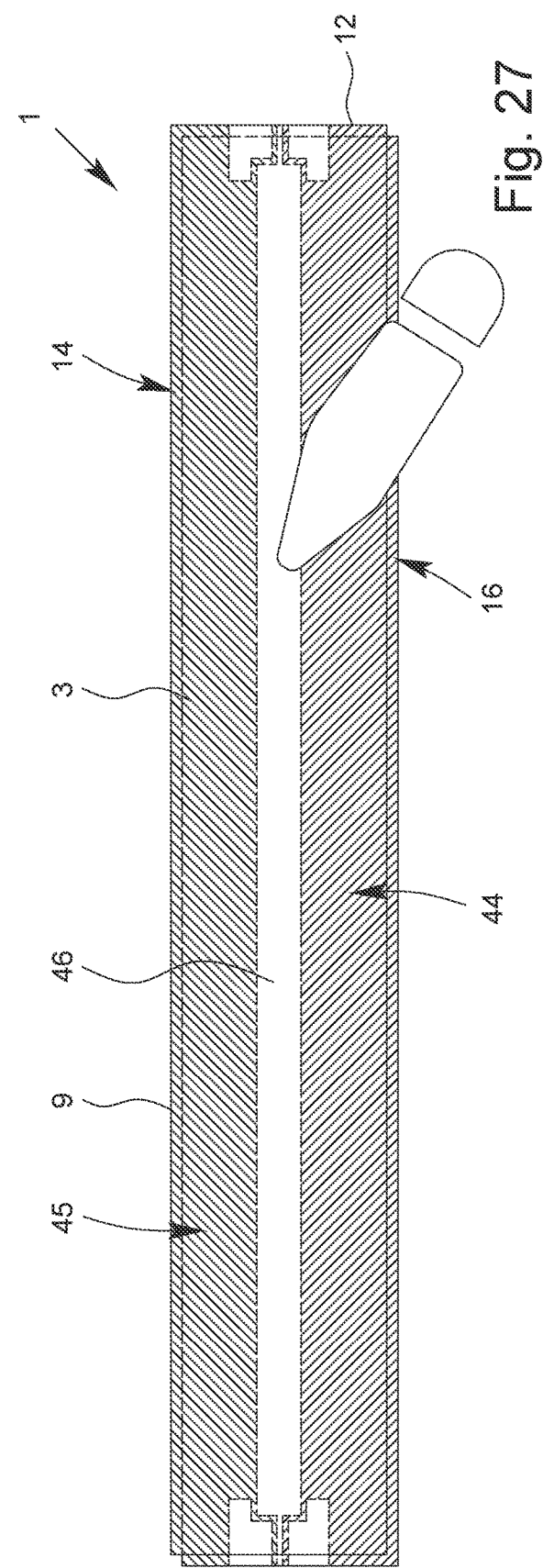
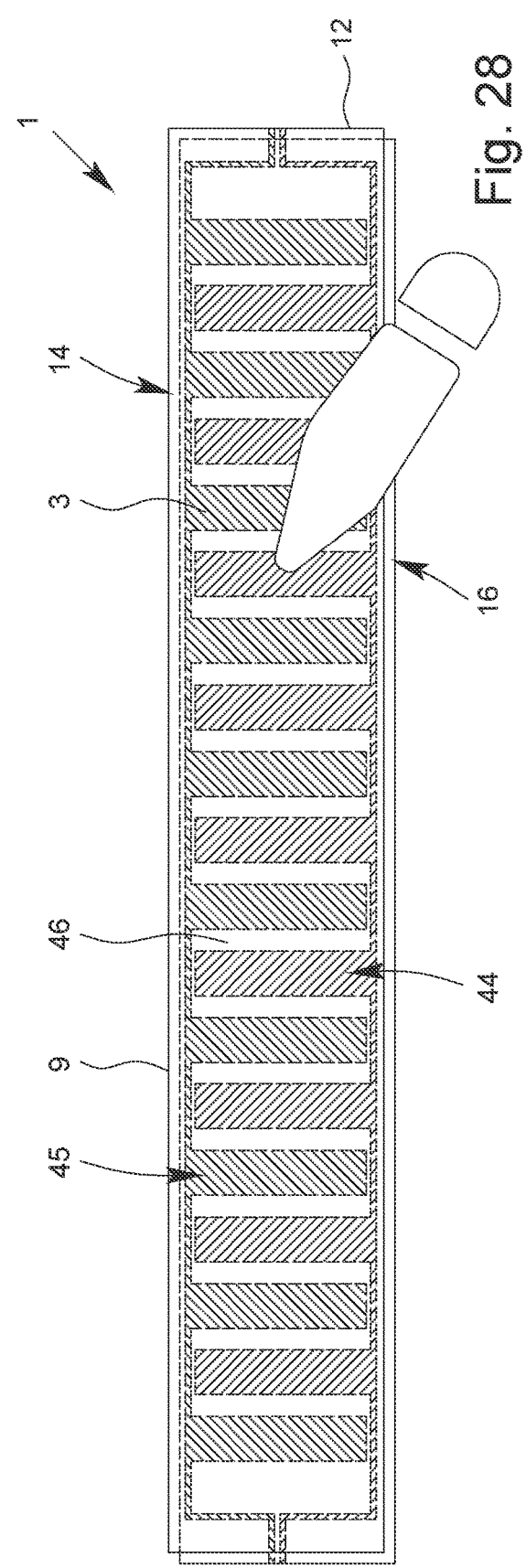

SURFACE ELEMENT

CROSS-REFERENCE TO RELATED APPLICATIONS

This application is a national stage application under 35 U.S.C. 371 of PCT Application No. PCT/EP2020/051913 having an international filing date of 27 Jan. 2020, which designated the United States, which PCT application claimed the benefit of German Application No. 10 2019 000 561.9, filed 28 Jan. 2019 and German Application No. 10 2019 110 650.8, filed 25 Apr. 2019, each of which are incorporated herein by reference in their entirety.

The present invention relates to a surface element, especially a floorboard, which is intended for use as a floor, wall and/or ceiling surface element for forming a floor, wall and/or ceiling coating. The surface element comprises at least one carrier plate and at least one functional layer. The carrier plate comprises a top side facing a usable side and an underside opposite the top side and facing the underground.

The coating can be laid directly or indirectly on the underground.

In the prior art, it is known to integrate functional layers, which especially provide electrical functionality, into the upper layer structure of the surface element. The functional layer can be used to produce different properties of the surface element and/or to measure different physical core variables, such as temperature, moisture or pressure.

However, the disadvantage of the state of the art is that electrical functionality is generally associated with high costs in production and subsequent installation. On the one hand, all surface elements have to be connected to each other via cable connections. On the other hand, it is known to arrange the functional layer above the carrier plate, especially if a luminescent layer is provided as the functional layer. A disadvantage of this arrangement is that it is difficult to ensure contact between the interconnected surface elements.

In addition, the electrical connections of the functional layers are exposed in practice to contamination, mechanical stresses due to mechanical effects on the surface and/or material-related vibration processes and/or moisture, which reduces the lifetime of the electrical functionality of the functional layer and/or disturbs or even interrupts the electrical contact between interconnected surface elements.

Furthermore, the functional layers known from the prior art produce a relief structure and/or a surface structure on the usable side of the surface element, which becomes visible after a certain period of use, for example after several months. Such a relief structure is perceived as disturbing by a user, wherein at the same time damage to the functional layer due to increased punctual stress cannot be ruled out.

Finally, the producing of surface elements comprising functional layer(s) is associated with a large number of difficulties and manufacturing challenges, especially since it must be ensured that the functional layer is not damaged when the individual layers of the surface element are connected.

The object of the present invention is to avoid or at least substantially reduce the disadvantages known from the prior art.

According to the invention, the above-mentioned object is solved in a surface element of the type mentioned above in that the functional layer is provided on the underside of the carrier plate and in that the functional layer is designed in such a way that it projects beyond the side edge of the side on at least one side in the installed state of the surface element. Preferably, the functional layer projects beyond the side edge of the long side on at least one long side in the installed state of the surface element.

According to the invention, the side edge is understood to be the outermost edge of the underside of the carrier plate. The functional layer protrudes and/or extends over this side edge in the installed state of the surface element.

The installed state is thereby understood to be the state of the surfacing element in which the surfacing element is connected to at least one further surface element.

According to the invention, it is understood that the functional layer also projects beyond the side edge of the surface element only in certain areas, preferably in contacting areas, in the installed state. In particular, a plurality of areas forming the projecting functional layer can thereby be provided.

It can thereby be provided that the functional layer is directly or indirectly connected to the carrier plate, preferably firmly. Direct connection thereby means that the functional layer is fastened directly on an underside of the carrier plate, whereas in the case of indirect connection at least one intermediate layer and/or coat is provided.

Especially the functional layer can be designed in one piece—i.e. as a single continuous layer—and/or in several pieces. Preferably, the functional layer comprises at least two interconnected layers or at least two electrically insulated and/or separated areas.

According to the invention, it is especially intended that the functional layer protrudes over the side edge of the side on at least one long side before installation. Accordingly, the functional layer can project over the side edge in the "separated" and/or "isolated" state of the surface element.

A number of advantages can be achieved by the solution according to the invention:

On the one hand, the integration of the functional layer, which especially provides electrical functionality, can be made both low-cost and very simple.

On the other hand, electrical and/or inductive contacting/coupling according to the invention, which takes place via the protruding area of the functional layer, ensures coupling of the functional layers of interconnected surface elements protected from dirt and/or moisture.

By arranging the functional layer on the underside according to the invention, it is possible to protect the functional layer from contamination and/or moisture. The stresses acting on the usable side, in particular moisture, can be kept at least essentially away from the functional layer.

In addition, the arrangement of the functional layer on the underside and the simplified contacting of the functional layers of adjacent and interconnected surface elements by means of the protruding area means that the arrangement of the functional layer and especially the provision of the, preferably electrical, functionality can finally be carried out independently of the producing of the surface element. This reduces production costs, among other things, since the functional layer can be applied, especially laminated and/or glued, to already manufactured surface elements. This reduces the producing and loading costs, in particular wherein no separate production line is required for the surface element comprising the functional layer.

According to the invention, it is alternatively or additionally possible that the functional layer can be arranged in the layer structure of the surface element during its producing. In this context, it can be provided that further layers, for example a countermove and/or an insulating layer, can be arranged underneath the functional layer, facing away from the usable side, and can especially be firmly connected to the functional layer.

In this context, it is essential to the invention that the functional layer is arranged below the carrier plate. It can be either directly or indirectly adjacent to the carrier plate and/or connected to the carrier plate. In particular, the functional layer can also be printed, especially to ensure individual specifications for individual surface elements.

In addition, time-consuming manual wiring of the individual surface elements to one another is avoided. The contacting of surface elements to be connected to one another, in particular the contacting and/or coupling of the functional layers of the surface elements to be connected to one another, can be ensured by the overlapping/protruding area of the functional layer, preferably without the need for a manual connection, for example cabling, of the functional layers—provided in addition to the connection of the surface elements—during laying.

After all, the functional layers are connected to each other by "pushing" and/or "pressing" them onto each other, wherein the pressure required for this can be ensured by the interconnected carrier plates. Consequently, the laying of surface elements comprising functional layers can also be carried out by amateurs, wherein the laying process is easy to implement. This enables the user to install a coating with a functional layer in a low-cost and simple manner, wherein a specialist does not necessarily have to be consulted for the installation.

According to the invention, a relief structure and/or surface structure that is perceived as disturbing and is caused by a functional layer arranged on the top side of the carrier plate can be avoided. The structures of the functional layer are at least essentially not visible on the usable side of the surface element, since the carrier plate comprises sufficient stability, strength and/or hardness, so that the structures and/or height differences of the functional layer are not reflected in the top side of the carrier plate and consequently also not on the usable side. The aesthetic impression and the visual perception of the surface element are therefore not impaired by the use of a functional layer, which actually also improves the feel of the entire surface element.

Alternatively or additionally, it can be provided that unevennesses of the underground and/or of the carrier plate are compensated by a subfloor and/or a compensation layer on the underside, especially wherein a so-called floating installation of the surfacing elements on the underside is made possible.

In addition, the stability, rigidity and/or strength of the surface element can be increased by arranging the functional layer underneath the carrier plate compared to surfacing elements known from the prior art. In the end, the functional layer, especially together with the countermove and/or as a countermove, can compensate for the bending stresses and/or the bending forces acting on the surfacing element, especially on the carrier plate. As a result, deformation and/or bending of the surface element can be better avoided.

Furthermore, the surface of a coating equipped with the functional surface is not only easy to lay, it can also be designed to be enlarged as desired. Finally, an arrangement of further surface elements comprising the functional layer can also be ensured subsequently—i.e. after the laying of the surface elements—so that a high degree of flexibility and individual adaptability can be ensured. In addition, the surface elements can also be reused—for example during renovation—since detachment (disassembly) of interconnected surface elements can be carried out in a manner known in the prior art. Especially the ecological sustainability of the surface elements is significantly improved.

Furthermore, the ecological compatibility can also be improved with regard to the recycling of the surface elements. By arranging the functional layer on a underside of the carrier plate, the functional layer can especially be detached from the carrier plate very easily, for example by peeling or tearing it off. Thus, the remaining surface element and/or the surface element that has been freed from the functional layer can be recycled in a "regular" manner—without having to pay attention to electrical components of the functional layer. Consequently, the simplest possible separation of the functional layer enables improved recycling.

Advantageously, electrical elements which comprise in particular a higher build-up height, preferably above 0.01 mm, in particular between 0.1 mm to 3 mm, further preferably between 0.2 mm to 1 mm, can be very easily integrated into the surface element on the functional layer and/or in the functional layer. In this context, it can be provided that—corresponding to the design of the electrical and/or electronic elements—recesses are provided on the underside of the carrier plate, which are designed to accommodate the electrical and/or electronic elements. Processors, sensors and/or energy supply means, for example accumulators and/or batteries, can be provided as electrical and/or electronic elements. The arrangement of such electrical elements is difficult if not impossible to implement in a functional layer provided on the top side, as is known from the prior art. After all, the height of the electrical elements opposes a smooth usable side of the surface element.

Preferably, the arrangement of the functional layer on the underside of the carrier plate allows increased flexibility with regard to the size of the individual components of the functional layer. This increases the flexibility for integrating different electrical elements in a surface element, wherein the selection of the electrical and/or electronic elements can be carried out on the basis of individual customer requirements.

Alternatively or additionally, it is also possible to arrange the electrical or electronic elements within the carrier plate, wherein the electrical elements can be connected with energy supply lines to the functional layer for the supply of electrical energy. This functional layer can ultimately ensure the supply of energy, preferably electrical energy, to the surface element.

In a particularly preferred embodiment of the present invention, corresponding tongue-and-groove joint geometries are provided on opposite sides of the carrier plate. The tongue-and-groove joint geometries serve especially to design and realize a click connection. In the case of a click connection, the sides corresponding to one another can be pivoted into one another and/or clicked into one another. The opposite sides of the carrier plate especially comprise a groove side having a groove and a tongue side opposite the groove side and comprising a tongue. The groove sides and the tongue sides can especially be provided both on the transverse sides and on the long sides of the carrier plate. In particular, tongue-and-groove joint geometries corresponding to each other are designed on the side edges of the carrier plate, in particular wherein the opposite sides—that is, the opposite transverse sides and the opposite long sides—are designed corresponding to each other. Accordingly, the carrier plate can comprise a longitudinal or long side formed as a groove side and a longitudinal or long side formed as a tongue side, as well as a transverse or short side formed as a groove side and a transverse or short side formed as a tongue side.

In a further embodiment, other tongue-and-groove joint geometries can be provided in addition to the tongue-and-groove connection geometries. Especially, push button and/or bayonet connection geometries are provided on opposite sides of the carrier plate.

Accordingly, a longitudinal and/or transverse side comprising the push button and a longitudinal and/or transverse side comprising a coupling opening corresponding to the push button may be provided. In the case of the bayonet lock, the surface elements can be connected to one another via the interaction of at least one protrusion and an opening corresponding thereto, in particular wherein the surface elements can be removably connected to one another via "insertion" and relative displacement with respect to one another.

Alternatively or additionally, it can be provided that the functional layer protrudes over the side edge of the groove side, preferably over the side edge of the groove side of the long side, in the installed state. The arrangement of the protruding area of the functional layer on the groove side enables improved connection of the functional layers of surface elements to be connected to one another. The groove and the at least indirect arrangement of the functional layer on the groove can ensure the stability of the functional layer in the protruding area. Furthermore, it is advantageous that the groove side rests on the floor and/or on the underground during installation and a tongue side of a further surface element corresponding to the groove side is pivoted into the groove side. This applies in any case if the groove/tongue connections of the individual surface elements are designed as click connections.

Consequently, the arranging the protruding area of the functional layer on the groove side prevents the protruding area of the functional layer from being pivoted in. Especially, installation errors with regard to the arrangement and connection of the functional layer(s) can be at least substantially avoided.

Preferably, the functional layer can close with the lowermost, outermost side edge of the carrier plate and/or be folded-in and/or folded-over in this area. Especially the functional layer does not protrude in the area of the tongue side.

Alternatively or additionally, it is especially provided that the functional layer is arranged at least in some areas on the area of the carrier plate opposite the groove side, wherein, preferably, the arrangement and design correspond to the at least partially protruding area of the functional layer on the groove side. In the installed state, this can finally make it possible, especially, for the protruding region of the functional layer to be designed so as to be at least partially contacting and/or inductively couplable to at least one region of the functional layer of the further surface element, which is arranged on an underside of the carrier plate, when the surface element is connected to a further surface element.

In addition, in a further, even more preferred embodiment of the idea of the invention, it is provided that the functional layer comprises, in its region projecting in the installed state, at least in a region-wise manner, at least one contacting area which is designed to be electrically contacting and/or electrically conductive and/or inductively couplable. As mentioned above, the functional layer can also project only in certain areas.

Alternatively or additionally, it can be provided that the functional layer comprises a further contacting area on the side opposite the contacting area, which is designed to be electrically contacting and/or electrically conductive and/or inductively couplable. Especially the "opposite side" is not to be understood restrictively as the top and/or underside of the functional layer. Moreover, the "opposite side" means the side provided at least substantially in the longitudinal edge region of the functional layer, which can be provided both on the top side and on the underside. Finally, the aforementioned arrangement of the further contacting area specifies that surface elements to be connected to one another can be coupled over the protruding area of the functional layer in which at least one contacting area is provided. The further contacting area can be designed to correspond to the contacting area, so that in the installed state the contacting area and the further contacting area overlap at least in some areas in at least one overlap region.

Preferably, the further contacting area is provided in the previously mentioned area below the carrier plate adjacent to the tongue side. The further contacting area of the functional layer—in the installed state—does not overlap the underside of the carrier plate, especially the longitudinal edge of the long side of the tongue side.

Further preferably, the contacting area and the further contacting area are designed to correspond to one another in such a way that, in the installed state, the contacting area of the surface element is electrically conductively connected and/or inductively coupled to a further contacting area of a further surface element which is connected to the surface element. Preferably, the contacting area directly adjoins the further contacting area of the further surface element in the installed state, at least in some regions, in particular wherein an arrangement of the contacting area and the further contacting area is designed to realize the aforementioned feature.

In particular, the contacting area and the further contacting area of a further surface element, which is connected to the surface element having the contacting area in the installed state, are arranged on top of each other and are finally also at least partially pushed onto each other and/or held against each other by the tongue-and-groove joint geometries in the installed state, especially wherein the connection of the surface elements to each other via the tongue-and-groove joint geometries enables a direct and exact arrangement of the contacting areas of the surface elements connected to each other.

Preferably, the functional layer is arranged on a support layer, at least in certain areas. The functional layer can be firmly connected to the support layer. Alternatively or additionally, it may be provided that the support layer forms the functional layer at least in regions and/or that the functional layer comprises the support layer. Arranging the functional layer on a support layer thereby makes it very easy to provide the functional layer in the layer structure of the surface element. Especially the functional layer can be laminated together with the support layer on an underside layer of the surface element, for example the carrier plate.

Especially in a further embodiment, it can be provided that the functional layer protrudes at least in some regions over the side edge of the surface element in the installed state, but without the support layer. Preferably, the functional layer can be arranged on the support layer and, at least in some regions, project beyond the side edge of the surface element in the installed state without the support layer.

Furthermore, the support layer can be formed by a layer provided underneath the carrier plate and/or by the underside of the carrier plate itself, in particular wherein the functional layer can be printed onto the support layer. The support layer can be designed to correspond to the manufacturing process of the surface element and/or to the connection provided between the functional layer and the support layer.

Especially the support layer can be designed at least in some regions at least on one side as an adhesive layer and/or as a support layer comprising an adhesive. Accordingly, the support layer can be arranged very simply on the surface element, especially the underside of the carrier plate.

In addition, it can be provided that the support layer is designed to be elastic and/or flexible. This enables space-saving storage of the support layer and also simplified arrangement of the support layer provided with the functional layer on the surface element.

According to the invention, it is possible for the support layer to comprise the and/or a functional layer on one side and/or on both sides, at least in certain regions. The arrangement of the contacting area can be provided on the top side of the support layer facing the carrier plate, both in the case of printing on one side and on both sides.

In a further preferred embodiment, it is provided that the further contacting area is arranged on the side of the carrier plate facing away from the support layer, especially on a underside of the support layer. Such an arrangement of the further contacting area is provided especially in the case of a double-sided arrangement of the functional layer on the support layer. An arrangement of the functional layer on both sides of the support layer makes it possible especially for the support layer to be arranged flush with and/or at least substantially directly adjacent to the tongue side of the carrier plate and to ensure a connection, which can thus be established, between the contacting area and the further contacting area of at least two interconnected surface elements. Preferably, in any case, the support layer and thus also the functional layer do not project beyond the tongue side of the carrier plate.

Preferably, in a further embodiment, it is provided that the support layer and/or the functional layer is folded in and/or folded over at least in sections on the tongue side, especially in the region of the tongue side of the carrier plate. The further contacting area can be provided on the folded-in and/or folded-over area of the support layer and/or the functional layer facing away from the carrier plate. An advantage of the folded-in and/or folded-over area of the support layer and/or the functional layer is that the functional layer need not be arranged on both sides of the support layer.

The folding-in and/or folding-over of the support layer thereby also enables the folded-in and/or folded-over area to be arranged at least partially overlapping with the protruding area of the functional layer or the support layer in the installed state. Thus, contacting of the contacting area and the further contacting area can be made possible even if the functional layer is arranged on the support layer on at least one side.

In addition, further advantages result from the folded-in and/or folded-over area of the support layer. For example, the folding or corresponding folding can result in a restoring force occurring in addition to the gravitational force, which in the installed state pushes the folded-in and/or folded-over area of the support layer, which comprises the further contacting area at least in certain areas, against the protruding area of the support layer, which comprises the contacting area.

In this context, it is advantageous if the folding in the "kink" of the folded-in and/or folded-over area provides an angle of less than 180°, especially between 90° to 179°, preferably from 100° to 170°. An arrangement of the folded-in and/or folded-over area on the protruding area of the support layer on the groove side enables better electrical contacting and/or improved inductive coupling, especially due to the available contact pressure.

In a further preferred embodiment, it is provided that the functional layer, preferably on the tongue side, is folded downward and/or folded in at least in sections—i.e., in particular facing away from the support layer—especially so that contact is provided between the functional layer of the surface element to the further functional layer of a further surface element below the support layers—in particular not between the connecting geometries—of the surface element and the further surface element. Preferably, the functional layer of the surface element does not extend into the region of the connecting geometries and/or is arranged in this region. Especially it can be provided that the functional layer is arranged below the connecting geometry—i.e. facing away from the support layer.

As explained previously, it is particularly preferred that the functional layer is provided on the support layer on one side, preferably on the top side of the support layer facing the carrier plate, and/or on both sides. Especially in the case of a double-sided arrangement of the functional layer on the support layer, it is provided that the functional layer of the top side of the support layer is connected to the functional layer of the underside of the support layer in an electrically conductive and/or inductively couplable manner by means of at least one connecting means. For example, rivets and/or staples, each of which is electrically conductive, can be provided as connecting means. Especially the connecting means is arranged at that point of the support layer at which the connection of the functional layers is to be made possible. It is thereby understood that more than one connecting means can also be provided, especially for a plurality of functional layers and/or for areas comprising functional layers.

The material of the support layer can be selected to correspond to the functional layer, the material of the further layers of the surface element, which are preferably directly connected to the support layer, and/or the electrical functionality of the functional layer. Especially it can be provided that the support layer comprises at least in some areas an electrically conductive and/or an electrically insulating material.

The electrically insulating material may be, especially for a thin support layer, a plastic material, wood, paper, cardboard, cork and/or felt and/or glass. More preferably, the support layer comprises as material polypropylene (PP), polyethylene (PE), polyvinyl chloride (PVC) and/or polyethylene terephthalate (PET).

Especially a metallic material and/or a material comprising at least one metal can be provided as electrically conductive material for the support layer. More preferably, the support layer comprises as material aluminum, copper, silver and/or gold and/or consists thereof. The aforementioned materials of an electrically conductive support layer can enable good electrical conductivity of the support layer, at least in certain areas.

An electrically insulating material of the support layer is characterized by the fact that the functional layer is actually not influenced by the support layer and/or that the functional layer can also be insulated, at least in certain regions, from the further layers of the surface element. Another advantage of an electrically conductive support layer is that the support layer itself forms the functional layer, at least in certain regions. This means that additional lamination and/or printing of the functional layer on the support layer can be avoided. This especially simplifies producing the functional layer and/or the support layer.

In a further, even more preferably embodiment, it is provided that at least one measuring device of the functional layer is arranged on the support layer. Preferably, the measuring device is printed on the support layer. For example, at least one sensor, preferably a pressure sensor and/or a capacitive sensor, can be provided as the measuring device.

Preferably, the measuring device is firmly connected to the support layer. In addition, the measuring device can be designed to detect the pressure change and/or capacitance change acting on the surface element A determination of the pressure change, especially of the pressure acting on the usable side of the surfacing element, is measured and/or detected by the measuring device, which is arranged on an underside of the carrier plate.

During the development of the invention, it was surprisingly shown that the arrangement of the functional layer on the underside essentially changes and/or influences the pressure measurement only insignificantly compared to an arrangement of the measuring device provided above the carrier plate, so that the pressure change acting on the surface element can be determined especially with a maximum deviation of +/−15%.

A capacitive sensor is especially to be understood as a sensor that operates on the basis of the change in electrical capacitance (e.g. of a single capacitor or a capacitor system). Finally, the capacitive sensor measures and/or detects a change in capacitance. A capacitance change can especially be caused by a change of an object (for example a person) on the top side of the surface element in the room (spatial change).

Alternatively or additionally, it can be provided that a capacitive pressure sensor is used as sensor.

Furthermore, a distance sensor and/or proximity switch can be used as a capacitive sensor.

Especially the capacitive sensor can be designed in such a way that for example the active sensor surface of the sensor detects the approach of a person and/or an object.

Especially, a pressure sensor is to be understood as a sensor that measures a pressure difference, a stationary pressure and/or pressure fluctuations. According to the invention, different designs of the pressure sensor are possible.

Furthermore, the pressure sensor can be designed in such a way that it detects the absence of a pressure change of a pressure acting on the surface element.

Detection of the change in pressure acting on the surface element is shown to be advantageous, for example, when the surface element is used to form a floor covering. Thus, according to the invention, it can be detected whether a person enters an area of a coating equipped with the functional layer and/or has fallen.

The same principle (pressure measurement) is also applicable when the surface element is stepped on, so that, for example, the area of the coating equipped with the functional layer can be used in combination with an alarm system. When "focused" and/or activated, stepping on the flooring, especially by a person, can cause an alarm to be triggered.

However, registering a fallen person is also beneficial, especially for morbid and/or sick and/or weak people whose health condition should be monitored. In this way, people who have fallen can receive help promptly, especially without having to trigger an alarm themselves. Long-term health damage can especially be reduced by this.

Preferably, the measuring device can be designed alternatively or additionally to determine temperature and/or humidity. Especially, monitoring of the building substance can take place in regions that are difficult to access, such as under a floor coating.

If the functional layer, especially the measuring device, comprises at least one capacitive sensor, it can be provided that the capacitive sensor of the measuring device extends at least substantially over the entire surface of the support layer and/or over the functional layer. Especially, the contacting area and/or the further contacting area comprises the capacitive sensor at least substantially over the entire surface.

Preferably, the capacitive sensor extends over part or all of the underside of the carrier plate—both in the case of an indirect and in the case of a direct connection to the carrier plate.

When a capacitive sensor is used to detect the change in capacitance, an electrical coupling of surface elements to be connected to each other is especially provided.

According to a further advantageous embodiment of the invention, at least two conductor paths of the functional layer are arranged on the support layer. Especially, the conductor paths have been printed on the support layer. The support layer can comprise the conductor paths in areas and/or on a top side of the support layer facing the underside of the carrier plate or additionally on an underside of the support layer facing away from the carrier plate.

If the support layer comprises the conductor paths at least in areas on both sides, it can be provided that the underside of the support layer provided with the conductor paths at least in areas forms and/or comprises the further contacting area.

A one-sided arrangement of the conductor paths on the support layer can be implemented especially in combination with the folded-in and/or folded-over area of the support layer. In this case, the region comprising the further contacting area at least in sections can be folded over, in particular wherein the further contacting area can comprise the conductor paths at least in sections. Especially the conductor paths are advantageously and/or provided for supplying power to the measuring device, especially the pressure sensor. Electrical energy can be transmitted between and/or among interconnected surface elements via the lines and/or conductor paths arranged in the contacting area and in the further contacting area.

It is possible to make electrical contact between the surface elements to be connected via the contacting area, the further contacting area and the conductor paths provided in the respective contacting areas. For this purpose, it is especially intended that the conductor paths of the contacting area overlap and/or intersect at least in some regions with the corresponding conductor paths of the further contacting area in the installed state of interconnected surface elements.

When using a capacitive sensor arranged at least substantially over the entire surface of the support layer, the use of conductor paths can be avoided.

Furthermore, the conductor paths can also be used to supply further electrical elements of the functional layer.

Preferably, the conductor paths are electrically insulated at least in some regions. Especially the conductor paths in at least one contacting area and/or at least one further contacting area are electrically insulated at least in some areas. Insulation can be provided in particular by an insulating protective coating which can be applied to the areas of the conductor paths to be insulated and, if necessary, also in additional areas to the support layer. By using an electrically insulating material on the conductor paths, a short circuit can especially be avoided when the contacting area overlaps with the further contacting area in which the conductor paths are respectively provided. This could occur if a conductor path were to intersect and/or contact at least two conductor paths of the corresponding contacting area and/or further contacting area.

Especially the electrically insulating coating and/or the electrically insulating material can be applied to those areas of the conductor paths and/or the functional layer(s) which—even if the surface elements are displaced relative to one another (at least in certain areas)—would allow electrical contacting of conductor paths which do not correspond to one another. It may be provided that in each case two conductor paths of the contacting area and the further contacting area are connected to each other.

In another particularly preferred embodiment of the invention, the conductor paths are arranged in at least one contacting area and/or in at least one further contacting area in such a way that, in the installed state of the surface element, they are electrically conductively connected and/or inductively coupled to the respective conductor paths of a further surface element connected to the surface element. The conductor paths of the surfacing element can be arranged to overlap with the conductor paths of the further surface element. In the case of an overlapping arrangement of the conductor paths, especially an electrical insulation of at least one conductor path is provided at least in certain areas.

Furthermore, especially at least one conductor path, preferably at least two conductor paths, comprises an angled arrangement and/or design in the contacting area and/or in the further contacting area and/or the conductor paths have been guided at an angle into the contacting area and/or the further contacting area. The conductor paths can comprise an at least substantially rectilinear section in the area of the contacting area and/or the further contacting area, in particular wherein the at least two conductor paths of the contacting area and/or the further contacting area can be arranged at least substantially parallel to each other. Further and/or other geometrical arrangements of the conductor paths in the area of the contacting area and/or the further contacting area can also be provided according to the invention. Especially the design of the conductor paths of the further contacting area is designed to be corresponding, symmetrical and/or mirror-inverted—in the installed state—with respect to the geometric design of the conductor paths of the contacting area.

In an even more preferably embodiment, it is provided that at least two pairs of at least two conductor paths each are provided in at least one contacting area and/or in a further contacting area. These pairs can be provided in a contacting area that extends especially over at least substantially the entire longitudinal groove side of the carrier plate. In addition, especially one pair each may also be arranged in a contacting area. Correspondingly, the arrangement of the pairs of conductor paths can be provided in the area of the further contacting area.

In this connection, it can be provided that the conductor paths extend in their at least substantially straight, rectilinear and/or at least substantially linear course over approximately 3 to 50%, preferably from 5 to 25%, even more preferably from 7 to 15%, of the length of the long side of the carrier plate in the region of the protruding area of the support layer or the functional layer. This makes it possible, especially, for the further surface elements to be displaced along the longitudinal side of the groove of the carrier plate or the surface element as required without the contacting being interrupted by the displacement. The possible longitudinally displaceable areas on the groove side of the carrier plate and/or the surface element can be specified to the user by laying specifications.

Furthermore, in another embodiment of the invention, it can be provided that at least one conductor path in the area of the contacting area and/or the further contacting area comprises a larger width than the corresponding conductor path of the further contacting area. Ultimately, it can be provided according to the invention that the conductor paths of the contacting area and/or the further contacting area differ with respect to their width. The conductor paths of the contacting area can comprise a width that is greater than the corresponding conductor paths of the further contacting area by 10% to 500%, preferably from 20% to 100%, even more preferably from 20% to 70%, or vice versa.

According to the invention, it is especially possible that only individual areas or sections of the conductor paths comprise the larger width. In this context, it is understood that both the conductor paths of the further contacting area and those of the contacting area can be designed as "more wider" conductor paths.

A different width of the conductor paths is advantageous in this respect, since when the further surface element is arranged against the surface element, a certain "freedom of movement" is created during the laying. Sufficient electrical contact can always be made between the conductor paths of the surface element and the further surface element, especially even if there is a gap between the tongue side of the further surface element and the groove side of the surface element.

Furthermore, wider conductor paths are also advantageous in that they ensure contacting by overlapping in the installed state, at least even if the surface elements, and in particular the functional layers of the surface elements also connected with them, move, especially—for example—due to shrinkage, or if deviations occur as a result of production.

Different widths of the conductor paths can thus compensate for laying-related overlap tolerances.

The width and/or the design of a conductor path can be designed as a function of the electrical voltage occurring and/or to be transmitted in the installed state.

Alternatively or additionally to a different width of the conductor paths, the distance between the conductor paths of a conductor path pair can be varied, especially increased, to improve ease of installation.

A processing device is associated to the functional layer and/or the measuring device more preferably. In particular, the processing device is provided in the functional layer and/or is designed as part of the functional layer, wherein it can be arranged on the support layer. The processing device can be designed to process the information recorded by the measuring device. In principle, it is also possible according to the invention for the processing device not to be arranged directly on the support layer. It can, for example, be provided externally to the surface element.

In a further preferred embodiment of the invention, it is provided that the measuring device and/or the processing device is connected to at least one information transmission path for transmitting the information recorded by the measuring device, especially processed by the processing device. The information transmission path may be provided and/or designed as a conductor path and/or as a component of the functional layer.

In particular, an information transmission interface may be arranged in at least one contacting area, wherein the information transmission interface is connected to at least one information transmission path. The contacting area may be the contacting area and/or the further contacting area of the functional layer.

In principle, the information transmission can also take place via the electrical conductor paths, especially the information transmission interfaces are not absolutely necessary for the information transmission.

Information can be transmitted to a further surface element via the information transmission interface, especially to an information transmission interface of the further surface element corresponding thereto. The information transmission interface can be arranged particularly preferably in the area of the contacting area and/or the further contacting area.

Alternatively or additionally, it is provided that the information transmission interface is designed for wireless information transmission, especially by radio, preferably via an antenna.

Advantageously, in the installed state, it is provided that the respective information transmission interfaces of—at least regionally—interconnected surface elements are arranged in an overlapping manner.

Preferably, the measuring device, the information transmission path and/or the processing device can be connected to at least one transmission device. Especially the transmission device can be designed as an antenna, so that the information can be transmitted by radio.

The transmission device can be designed alternatively or additionally for, preferably wireless, transmission of information to a, preferably external, evaluation device. The evaluation device can especially evaluate the measured information, which has preferably already been processed by the processing device. The evaluation device can recognize whether a signal is to be used for alarming and/or signaling or the like. In any case, a signal could be triggered if the surface element is subjected to pressure, possibly for a longer period of time, for example by a person standing and/or lying on the surface element.

Furthermore, at least one pressure sensor of the measuring device can be electrically connected to at least two conductor paths, in particular wherein the electrical connections (conductor paths) are designed with multiple poles and/or different poles.

Especially it is provided that the functional layer comprises and/or consists of a printed circuit.

Preferably, the functional layer may have been printed directly onto the support layer. In the case of manufacturing by a printing process, one of the advantages is that the functional layer can be firmly connected to the support layer directly during its manufacturing. In addition, the functional layer can also be adapted at least essentially individually or purpose-specifically to the respective surface element. In addition, printing the functional layer and/or printing the functional layer at least partially (in certain regions) provides a simple means of making the connection and manufacturing the functional layer. The functional layer can be designed to be printable by means of digital printing, screen printing and/or web offset printing. Furthermore, it may have been printed by means of a conductive material, especially for the application of printing. For example, an ink comprising silver pigments may be provided. The material of the functional layer is selected as a function of the electrical functionality of the functional layer, the occurring stress and/or as a function of the printing process.

In a further embodiment of the invention, the support layer is designed with its top side facing the carrier plate as a separate layer for connection to a further layer of the surface element, especially the carrier plate. Preferably, the functional layer is also arranged on the top side of the support layer facing the carrier plate. The support layer need not thereby be designed over the entire surface for connection. Especially only partial areas of the support layer can be used for the connection. Especially the top side of the support layer and/or the underside of the support layer can be designed as an adhesive film, at least in some regions. The design as an adhesive film results in a simplified arrangement of the support layer to further layers of the surface element, especially to the carrier plate.

In the design of the surface element, it is preferably provided that at least one, preferably multilayer layering is arranged on the top side of the carrier plate. The layered structure can be firmly connected to the carrier plate. Thereby, the layered structure can furthermore be designed to protect the carrier plate, wherein the top side of the layered structure can form the usable side of the surface element. Accordingly, the upper layer structure is exposed to the stresses of the surface element. In this context, it is advantageous if the layer structure comprises at least one wear layer which at least substantially faces the usable side and, in addition, also comprises wear-resistant particles, especially corundum, and/or comprises and/or consists of plastic as material, especially polyethylene (PE), polypropylene (PP), polyvinyl chloride (PVC) and/or polyethylene terephthalate (PET).

In an even more preferably embodiment, it is provided that the layered structure comprises at least one decorative layer, especially a decorative film. In this context, it may be provided that the surface element can ultimately be used as a laminate. It may also be provided for the surface element to be used as a parquet flooring. In this embodiment, the layered structure can comprise at least one real wood top layer.

In addition, the layer structure can also comprise a cover layer, which in particular comprises the wear layer. The cover layer, in particular an overlay, can serve to seal the decorative layer. Alternatively or additionally, it can be provided that a real wood top layer can be protected by a protective layer and/or sealant which can be applied to the top side of the real wood top layer. The multilayer layering and/or the layers of the multilayer layering can especially be laminated onto the carrier plate. Alternatively or additionally, it can be provided that the layered structure is pressed to the carrier plate.

In a further, even more preferably embodiment of the invention, it is provided that a countermove is arranged facing the underside of the carrier plate. Especially the countermove can serve to absorb bending stresses and/or to compensate the bending stresses of the surface element, especially of the carrier plate. A kraft paper can be provided as a countermove. Alternatively or additionally, it is possible for the functional layer to be arranged between the countermove and the carrier plate, preferably immediately adjacent to the carrier plate, and/or below the countermove. Furthermore, it may be provided that the support layer and/or the functional layer is formed by the countermove. This essentially means that the support layer then performs a dual function, namely that of countermove on the one hand and base for the functional layer on the other.

Furthermore, a damping layer can be arranged in the layer structure of the surface element, especially for impact sound insulation. The damping layer can face the underside of the carrier plate. In particular, it can be directly adjacent to the countermove. The damping layer can be a film layer comprising plastic and/or a layer comprising foam, in particular wherein the damping layer is formed as a support layer and/or the support layer is formed as a damping layer and/or wherein the functional layer and/or the support layer is firmly, preferably directly, connected to the damping layer. The damping layer can also be provided to compensate for unevenness of the underground. Eventually, the damping layer enables an improved arrangement and/or adaptation of the surface element to the underground.

Preferably, the carrier plate can be an HDF plate (high-density fiberboard), a real wood layer and/or an MDF plate (medium-density fiberboard). The aforementioned carrier plates are characterized by high rigidity in connection with high stability, which they can provide for the entire surface element.

Furthermore, polyvinyl chloride (PVC), cork and/or mineral materials may be provided as the material for the carrier plate.

In another particularly preferred embodiment, the functional layer is associated with a negative mask layer for compensating for protruding contours. The negative mask layer can be used in particular to protect the functional layer from stresses, especially from different heights of the functional layer, especially when the surface element is loaded.

According to another particularly preferred embodiment of the invention, it is provided that the functional layer is formed at least in some areas, preferably completely, by an electrically positively or negatively charged area, especially if the measuring device comprises a capacitive sensor.

Alternatively or additionally, it can be provided that the functional layer, in particular the functional layer designed as a capacitive sensor, is designed in multiple parts, in particular wherein the parts (areas and/or layers) of the functional layer are electrically separated and/or insulated from one another. Especially at least one electrically positively charged area and at least one electrically negatively charged area of the functional layer can be provided.

Preferably, the electrically positively charged and negatively charged areas of the functional layer are arranged—at least indirectly—on an underside of the support plate in such a way that, when a person steps on the surface element, it can be ensured that both a positively charged and a negatively charged area of the functional layer are contacted—at least in some areas. This is especially advantageous for the capacitive sensor.

In this context, it can be provided that the functional layer is arranged at least substantially over the entire surface—at least indirectly—on the underside of the carrier plate and is formed by at least one positively charged region and one negatively charged region. The positively charged area and the negatively charged area can each adjoin a longitudinal edge and preferably be electrically separated from one another by an at least substantially linear, corrugated, zigzag and/or curved separating area and/or insulating area.

In further preferred embodiments, the aforementioned insulating region can also be designed—at least regionally, preferably completely—to be at least essentially rectangular.

Further, the present invention relates to a system having a plurality of surfacing elements, wherein at least one surfacing element is designed according to one or more of the embodiments described earlier. The surfacing element is connected to further surface elements to form a coating.

According to the invention, it can be provided that the further surface elements are also designed—at least partially—according to at least one of the embodiments described above.

It is understood that in connection with the system reference may be made to all the advantages and/or particular embodiments of the surface element according to the invention described earlier, which also apply in the same way to the system according to the invention. In order to avoid unnecessary repetition, reference is thus made in this respect to the previous embodiments.

Furthermore, according to the invention, it is possible for the further surface elements to serve as "conductor floorboard"—that is, to comprise a functional layer but no measuring device. Eventually, the surface element can comprise the measuring device, wherein the measurement result recorded by the surface element can be transmitted via the further surface elements due to the direct connection with further surface elements and/or the surface element can be supplied with energy by the further surface elements.

According to the invention, the system provides a coating which comprises an electrical functionality at least in certain regions. In this context, the further surface elements do not necessarily have to comprise a functional layer.

Especially associated to the functional layer is a, preferably external, energy supply device. By means of the power supply device, which is connected, for example, to at least one functional layer of at least one surface element (for example, via a cable), the entire coating and/or at least areas of the coating can be supplied with power. Preferably, the power supply device is electrically conductively connected to the functional layer and/or inductively coupled to the functional layer.

The power supply device can also provide the energy required for the measuring device. For the capacitive sensor, the power supply device can alternatively or additionally provide the required electric field and/or transmit the electric current required for the pressure sensor.

The advantage of the aforementioned power supply device is that a power supply device does not have to be associated to each individual surface element. The surface elements and/or the further surface elements can be jointly supplied by at least one power supply device by means of their electrical connection and/or inductive coupling to one another. This simplifies the provision of a coating and/or system according to the invention.

In the aforementioned arrangement of the surface element to further surface elements, explicit reference may be made in this context to the overlapping of the electrical conductor paths. It is particularly advantageous that, in the case of an overlapping arrangement of the conductor paths correlating with one another, different thicknesses and/or widths and/or lengths of the conductor paths are provided. Electrical insulation to prevent a short circuit is also advantageous in the connection of the surface element to the further surface elements.

Furthermore, in an additional embodiment of the invention, a substance-bonded connection, preferably an adhesive connection, can be provided in addition to the click connection of at least one surface element to at least one further surface element. In particular, the functional layers and/or support layers of the surface elements can be connected to one another in a substance-bonded, especially glued, manner. Provision can thereby be made for the protruding area of the surface element to be substance-bonded, at least in some areas, to the further contacting area of the further surface element.

In an even more preferably embodiment, the protruding area of the surface element can be designed at least in some areas as an adhesive strip, preferably covered by a liner.

For the aforementioned adhesive bonding, an electrically conductive and/or a non-conductive material, especially adhesive, can be provided. In addition, in a further embodiment, the substance-bonded connection can also be designed to be removable and/or permanently fixed.

Preferably, at least one, preferably external, operating device for controlling the functional layer is associated to the functional layer. Especially the operating device can "activate" the functional layer and/or supply it with electrical energy, especially for activation. Finally, the measuring device of the functional layer can be controlled and/or regulated, in particular activated, via the operating device. In addition, individual areas of the coating and/or individual surface elements can also be activated.

In connection with the design as a capacitive sensor of the measuring device, it can be provided that two different types of surface elements can be used within a coating.

One surface element can serve as a "connection floorboard" which is connected to a power supply device, especially an external power device, for supplying the functional layer with electrical charge and/or electrical energy. Furthermore, the first type of surface element may also be couplable to a processing device, especially for determining the electrical capacitance change. Preferably, at least two separate electrically conductive surfaces of the functional layer are provided, which can be supplied with positive and/or negative electrical charge by the power supply device, so that eventually the connection floorboard comprises positively and negatively charged surfaces.

The two separate electrically conductive surfaces of the connection floorboard provide the respective charge to a further type of surface element, in particular a "conductor floorboard". The conductor floorboard can serve to pass on the electrical charge and/or the electrical energy via the electrical contact with the "connection floorboard", so that a conductor floorboard can in principle comprise a functional layer, which can consist of and/or comprise a fully conductive support layer. The sensor area is increased by the conductor floorboards and especially by the transfer of the electrical charge and/or energy to further surface elements.

According to the invention, it is not necessary to use sensors with coils or capacitive pressure sensors to detect the capacitive changes.

Furthermore, a control device, preferably external, can be associated to the functional layer, the measuring device and/or the processing device. Especially the functional layer, the measuring device and/or the processing device can be designed to be controllable and/or adjustable by the control device. Preferably, the functional layer, the measuring device and/or the processing device of at least one surface element is wirelessly connected to the control device, which can transmit the signals especially to the transmission device of the surface element and/or to a receiver device of the surface element.

In the system according to the invention, the surface element associated with the power supply device may be referred to as the "connection floorboard".

The further surface element can especially not be connected to a power supply device, so that the further surface element is afterwards designed as a "conductor floorboard" for the transmission of electrical energy, electrical charge and/or information.

In the case of a coating formed by the surface elements and the further surface elements, provision can be made for at least one surface element to be connected to the power supply device. Especially according to the invention, it is not necessary that all surface elements be directly connected to one power supply device each or to a common power supply device.

In an even more preferably embodiment, it can be provided that at least one surface element—especially either the at least one surface element and/or the further surface element—is designed as a "connection floorboard". The connection floorboard can be designed for connection and/or for contact, especially for electrical connection, to an external device, for example a power supply device. An external device is to be understood in particular as an element and/or a device which essentially does not constitute a surface element according to the invention. The connection between the connection floorboard and the external device can also be removable, conditionally removable and/or permanently fixed. Possible connections between the connecting floorboard and the external device can be frictionally, force-locked and/or substance-bonded and/or can be designed as a contact connection, screw connection, Velcro connection, plug-in connection, riveted connection, welded connection, soldered connection, crimped connection and/or adhesive connection.

Preferably, the connection between the connection floorboard and the external device can be designed as multipole, especially two-pole.

In addition, the connection described earlier between the connection floorboard and the external device can enable a power supply to the coating and/or the system according to the invention. Furthermore, the connection can be used alternatively or additionally for information forwarding, especially by wire. The connection floorboard and/or its functional layer can furthermore comprise, at least in some areas, a contacting surface for connection and/or contacting of another functional layer of another surface element.

Insofar as a capacitive sensor is provided as the measuring device and/or the measuring device comprises a capacitive sensor, it is especially advantageous if the "connection floorboard" and/or the surface element comprises at least one electrically positively charged area and at least one electrically negatively charged area of the functional layer, in particular wherein the positively charged and the negatively charged areas are electrically separated from one another and/or are jointly arranged at least substantially over the entire surface—at least indirectly—on an underside of the carrier plate.

In this context, it is more preferably the case that the "conductor floorboard" on an underside of the carrier plate comprises, at least substantially over the entire surface, an electrically positively or negatively charged functional layer whose measuring device is designed as a capacitive sensor, in particular so that the entire functional layer actually forms the capacitive sensor.

In principle, it can be provided according to the invention that if the measuring device comprises a capacitive sensor, the functional layer can comprise electrically neutral surfaces.

Alternatively or additionally, only one electrically charged area (positive or negative) can be provided, which can cooperate with a further electrically charged area and/or region of the evaluating device for the detection of a capacitance change. In this context, it may be provided that within a system the surface element ("connection floorboard") comprising the capacitive sensor comprises only one electrically positively or negatively charged functional layer and/or sensor area.

Furthermore, the present invention relates to a method for producing a surface element according to one of the embodiments described earlier, wherein the method comprises the following steps:

A) providing a tongue-and-groove joint geometry in a carrier plate, especially for the purpose of designing a click connection;

B) applying a functional layer on the underside of the carrier plate, wherein the functional layer is arranged on the carrier plate in such a way that the functional layer projects on at least one side, in particular on at least one long side, beyond the side edge of the side, in particular of the long side, in the installed state of the surfacing element;

wherein process step B) is carried out subsequently to process step A).

It is understood that the previous explanations of advantages and preferably embodiments of the surface element according to the invention also apply in the same way to the method according to the invention. In order to avoid unnecessary repetitions, reference is therefore expressly made to the preceding explanations.

In a further preferred embodiment of the method, it can be provided that at least one, preferably multilayer layering is arranged on the top side of the carrier plate before method step A) or after method step A), especially before method step B) is carried out. The layered structure can be firmly connected to the carrier plate. The layered structure can thereby comprise a wear layer, a decorative layer, especially a decorative film, and/or a cover layer, especially an overlay.

The multilayer layering and/or the layers of the multilayer layering can especially be laminated onto the carrier plate. Alternatively or additionally, it may be provided that a real wood top layer is protected by a protective layer and/or sealant which is applied to the top side of the real wood top layer.

Alternatively or additionally, it may also be provided that the layered structure is pressed to the carrier plate.

Especially step B) is carried out after the laminating and/or pressing of the layered structure and the carrier plate.

Preferably, the tongue-and-groove joint geometries are milled, embossed and/or cut into the sides of the surface element, especially the carrier plate.

Furthermore, in an even more preferably embodiment of the idea of the invention, subsequently to the process step B), the functional layer can be folded downwards and/or folded-over at least in sections on at least one side edge, in particular on a tongue side, i.e. facing away from the carrier plate.

Furthermore, before process step B) or after process step B) has been carried out, at least one recess, especially a milled recess, can be provided in the underside of the carrier plate. The recess can be cut, milled and/or stamped into the carrier plate. In addition, the recess can be provided for accommodating an electronic component, which can especially be accommodated therein.

Moreover, it is understood that any intermediate intervals and individual values are included in the aforementioned intervals and range limits and are to be considered disclosed as essential to the invention, even if these intermediate intervals and individual values are not specifically provided.

Further features, advantages and possible applications of the present invention will be apparent from the following description of examples of embodiments based on the drawing and the drawing itself. Thereby, all features described and/or illustrated constitute the subject matter of the present invention, either individually or in any combination, irrespective of their summary in the claims or their correlation.

Figure 2:
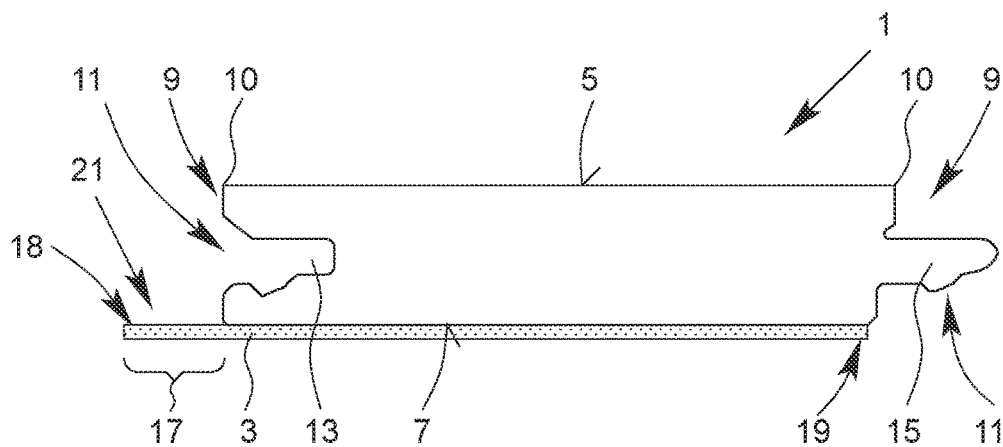
Figure 3:
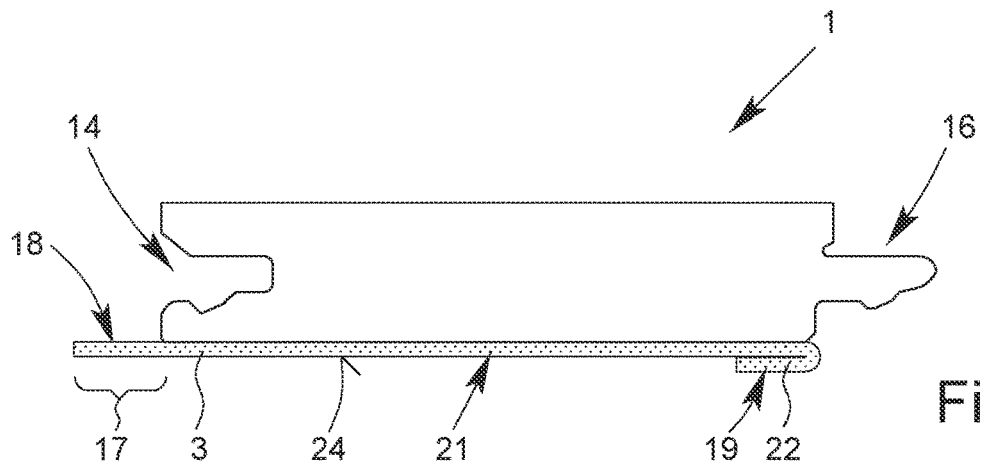
Figure 4:
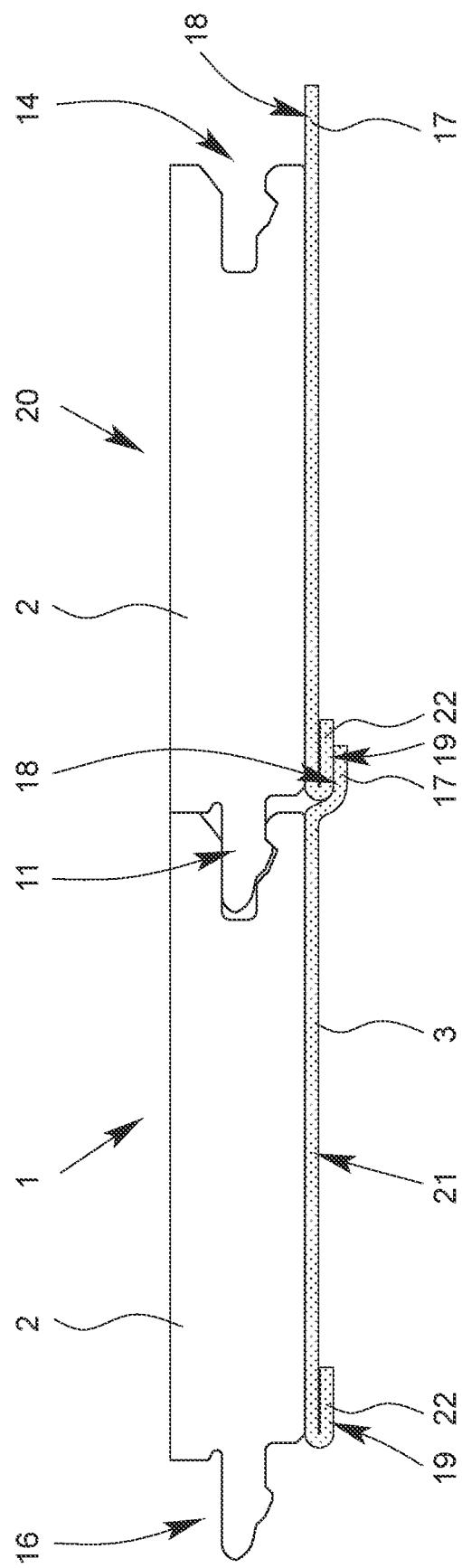
Figure 5:
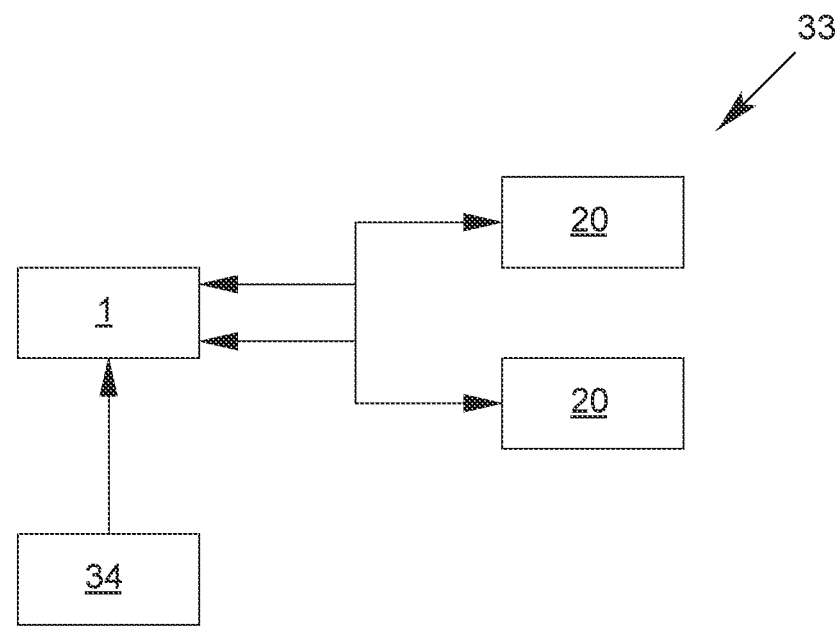
Figure 6:
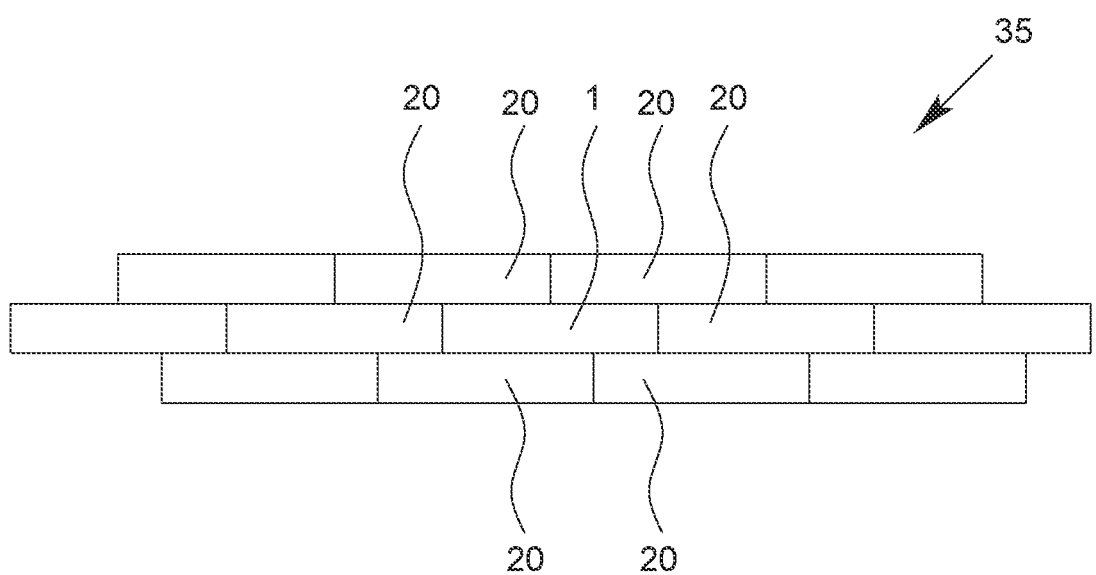
Figure 7:
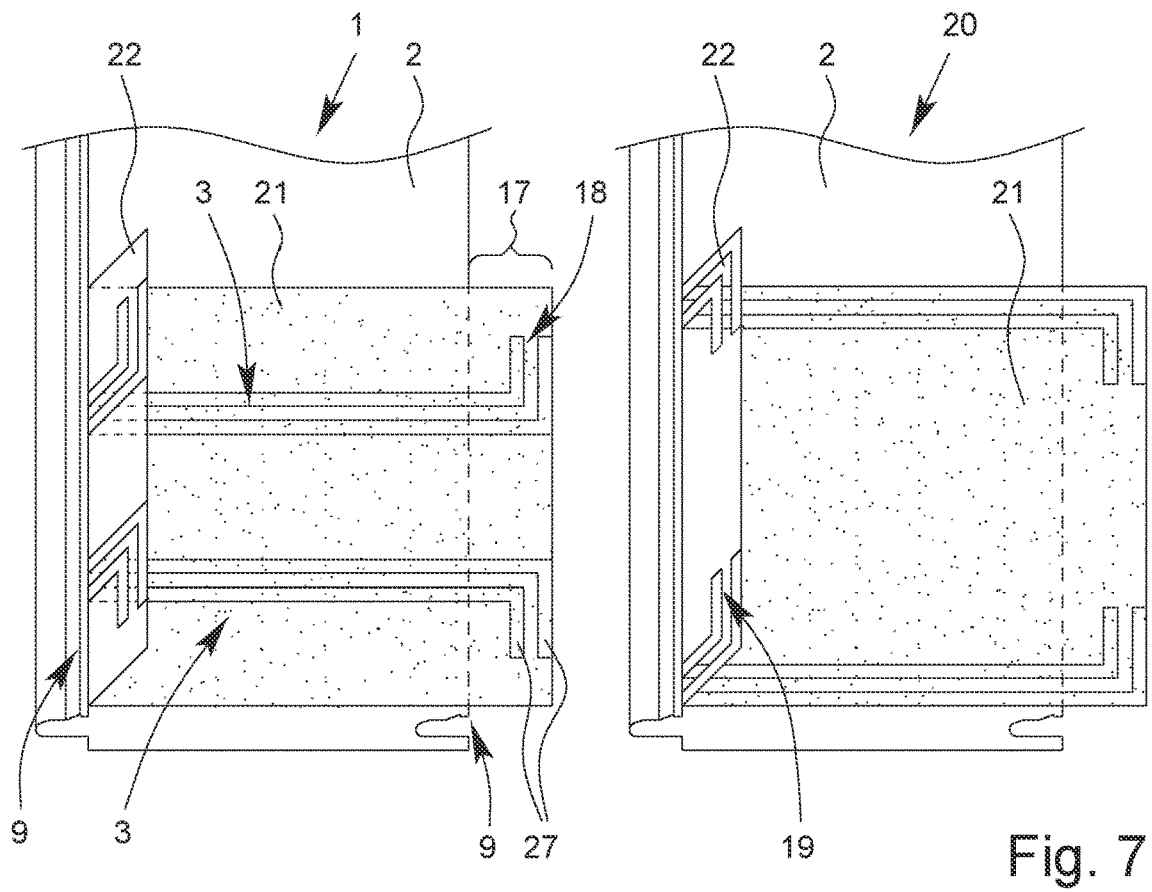
Figure 8:
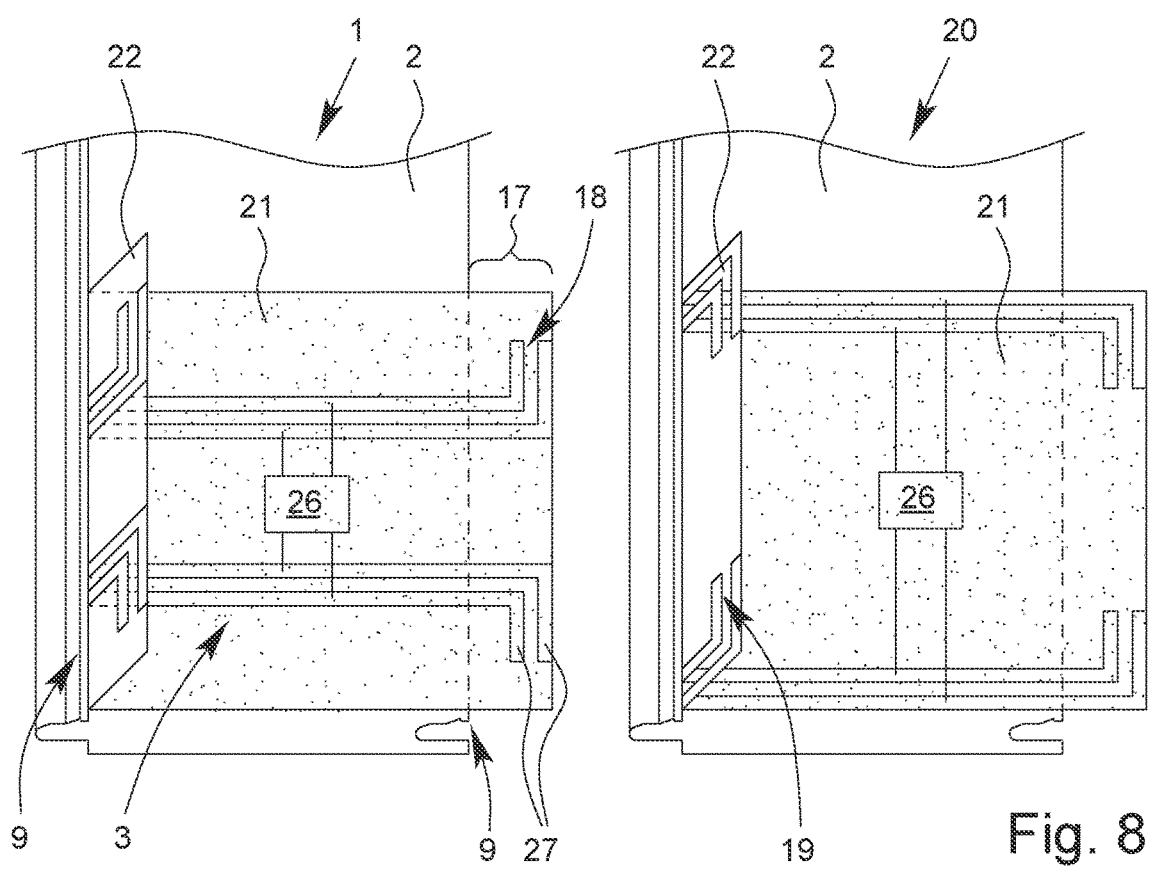
Figure 9:
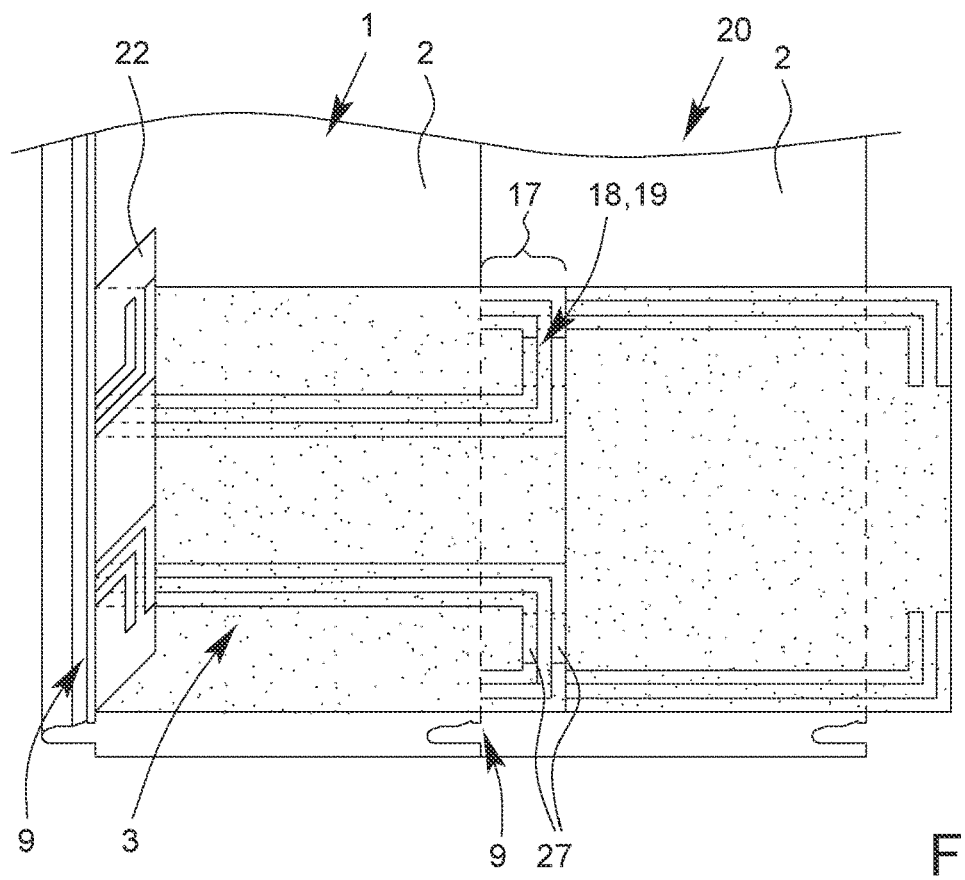
Figure 10:
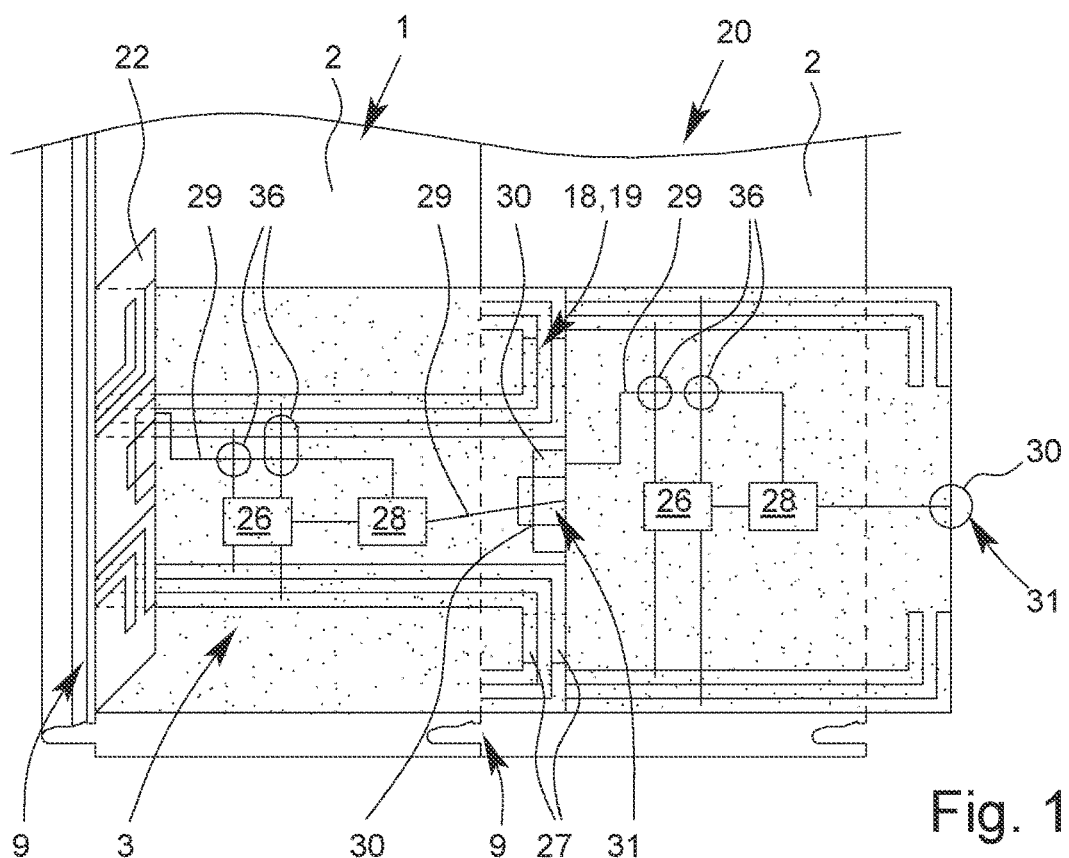
Figure 11:
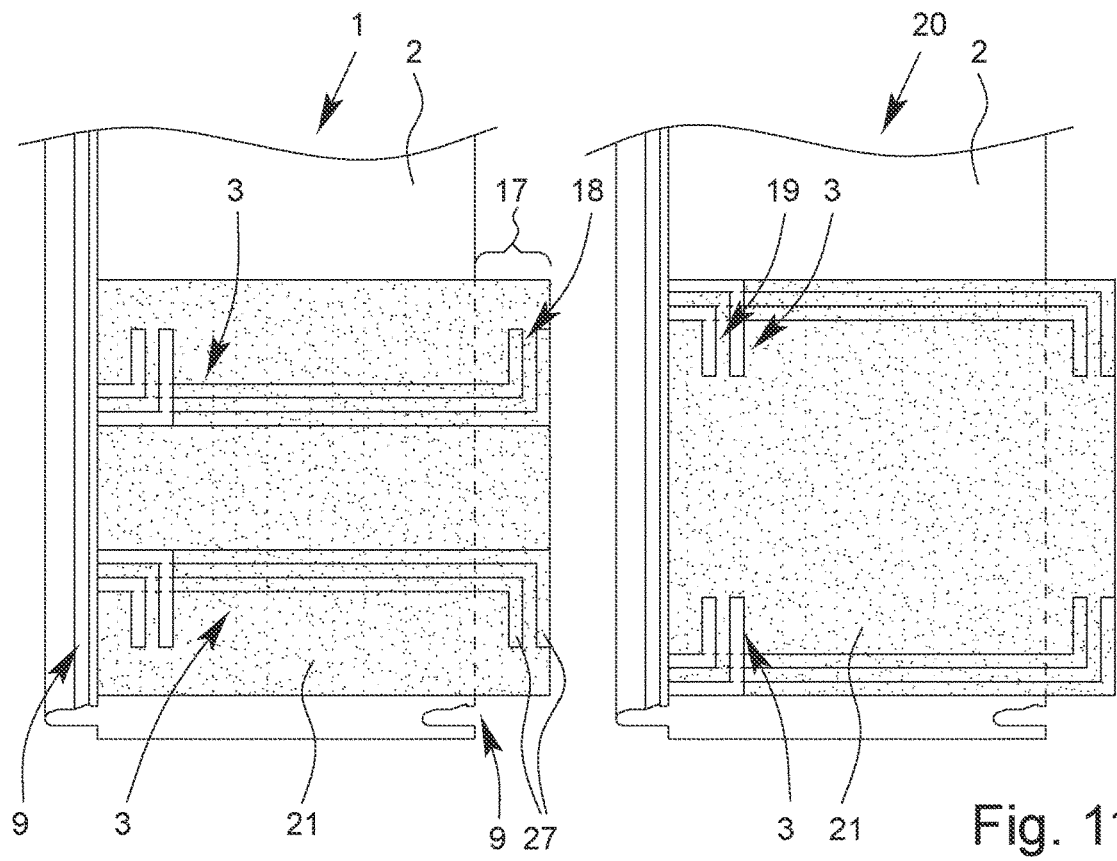
Figure 12:
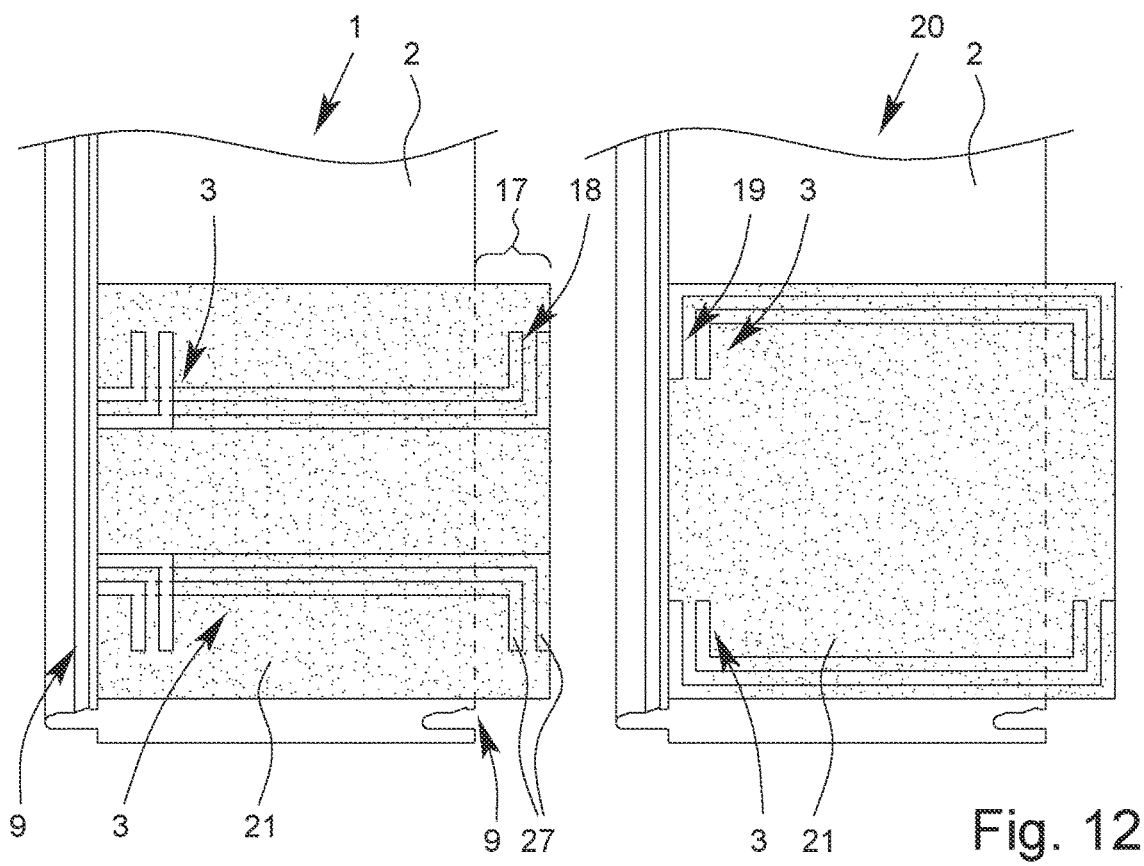
Figure 13:
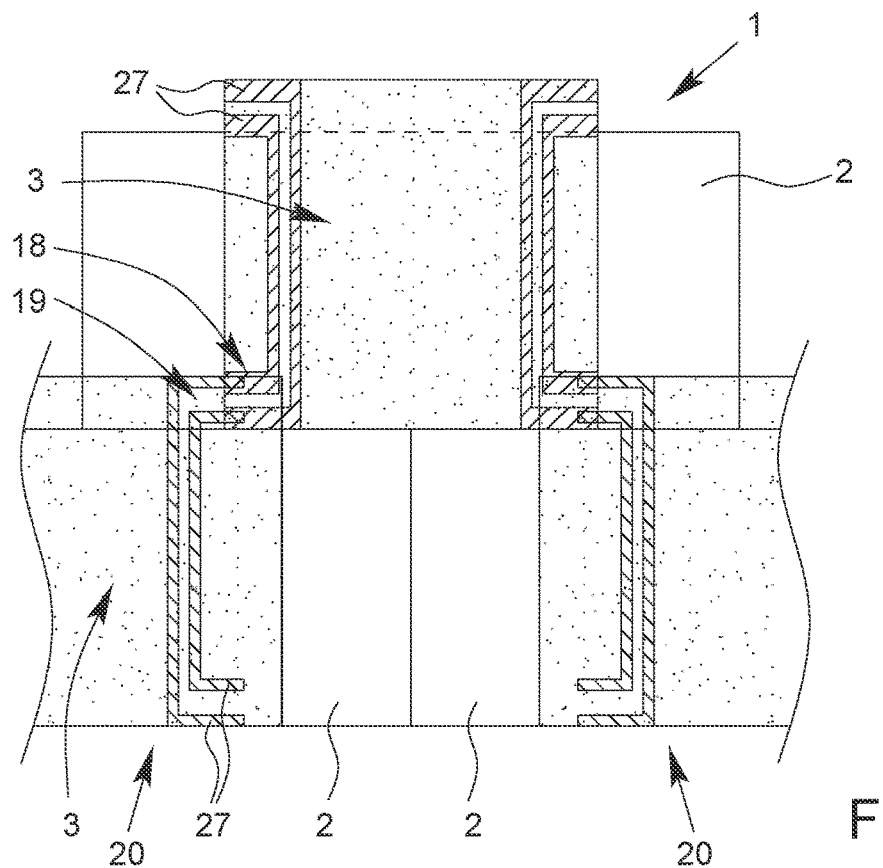
Figure 14:
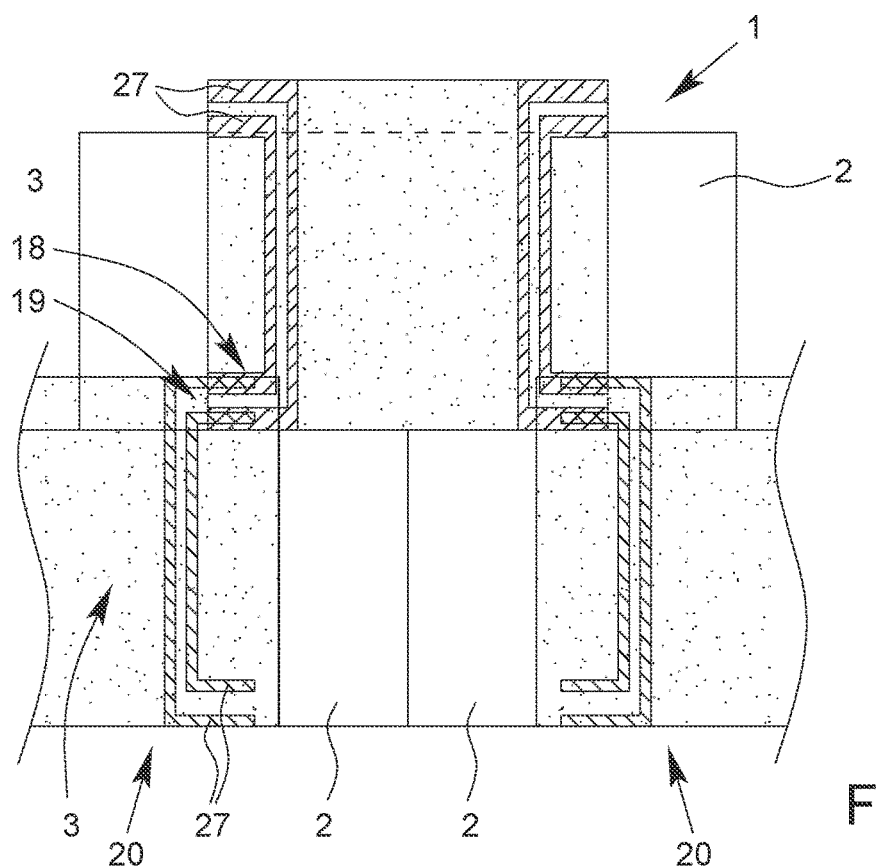
Figure 15:
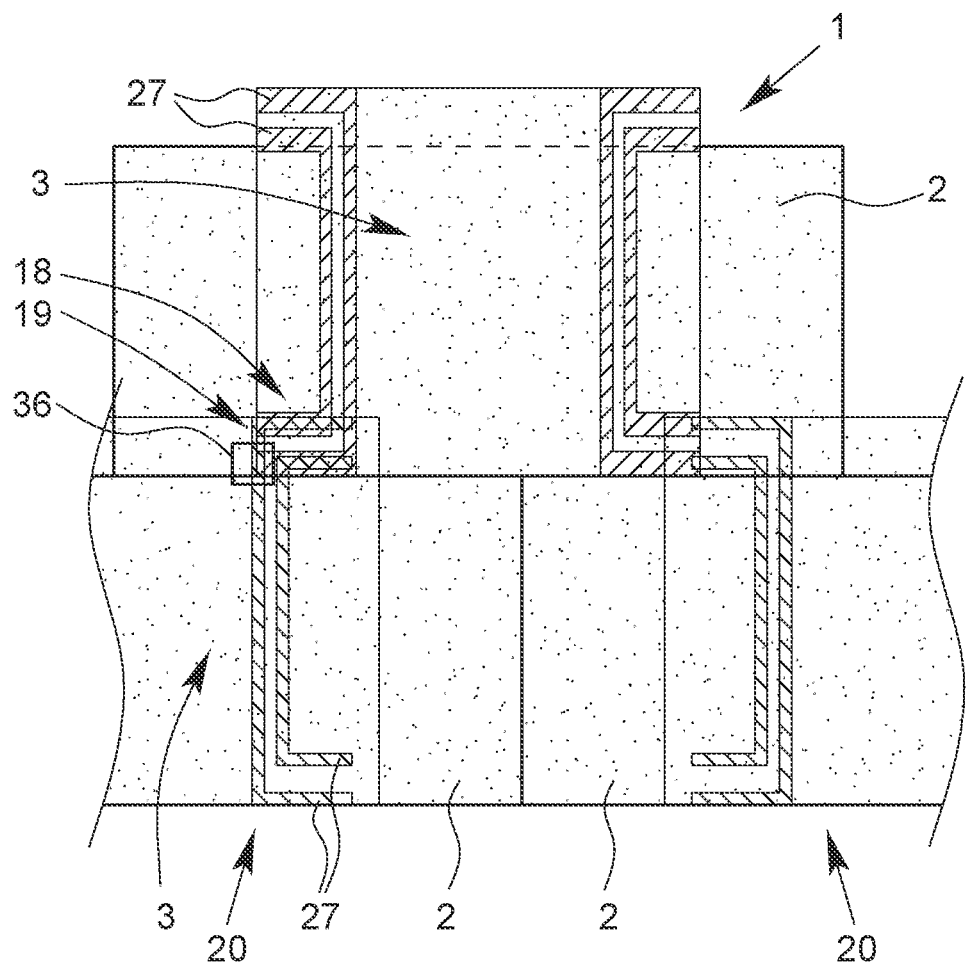
Figure 16:
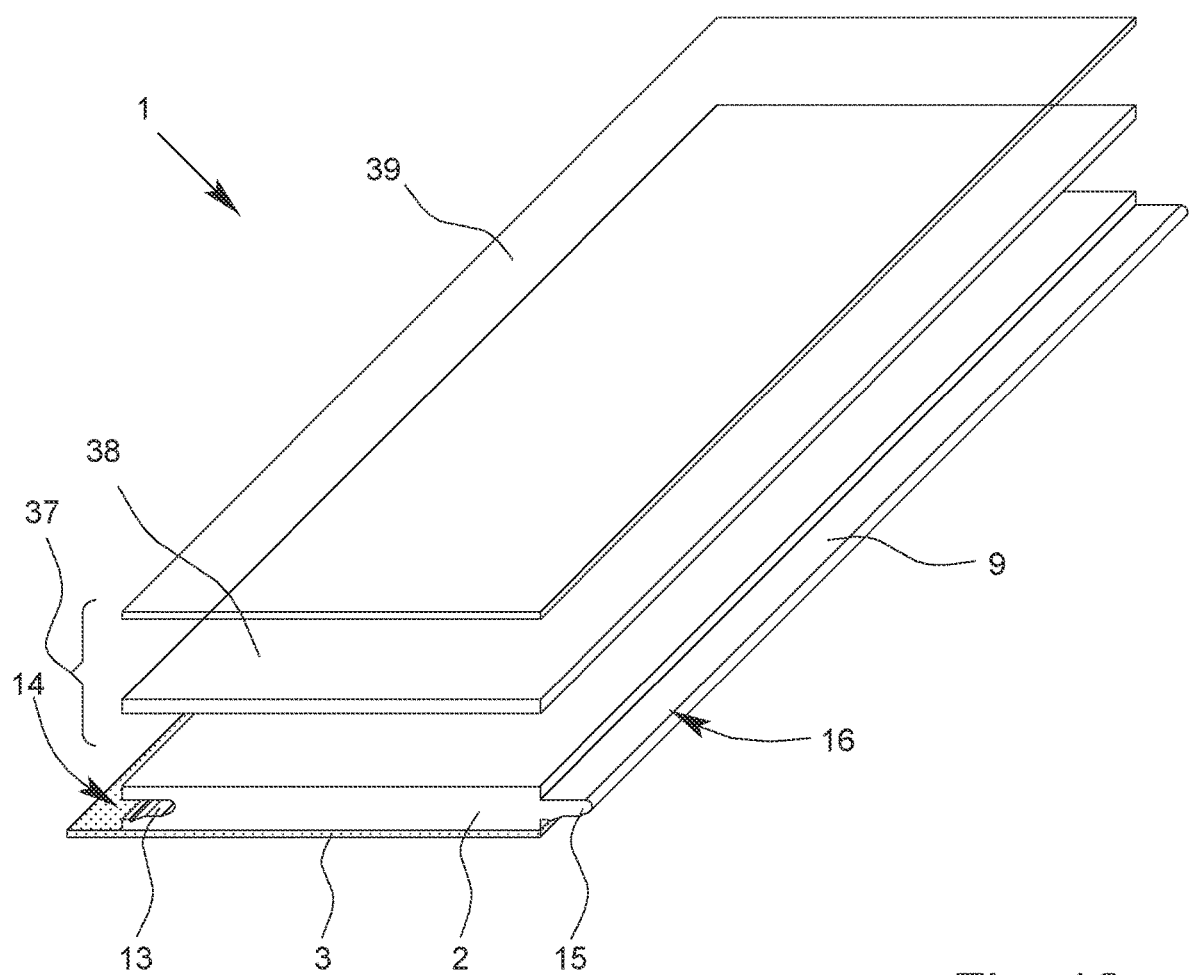
Figure 17:
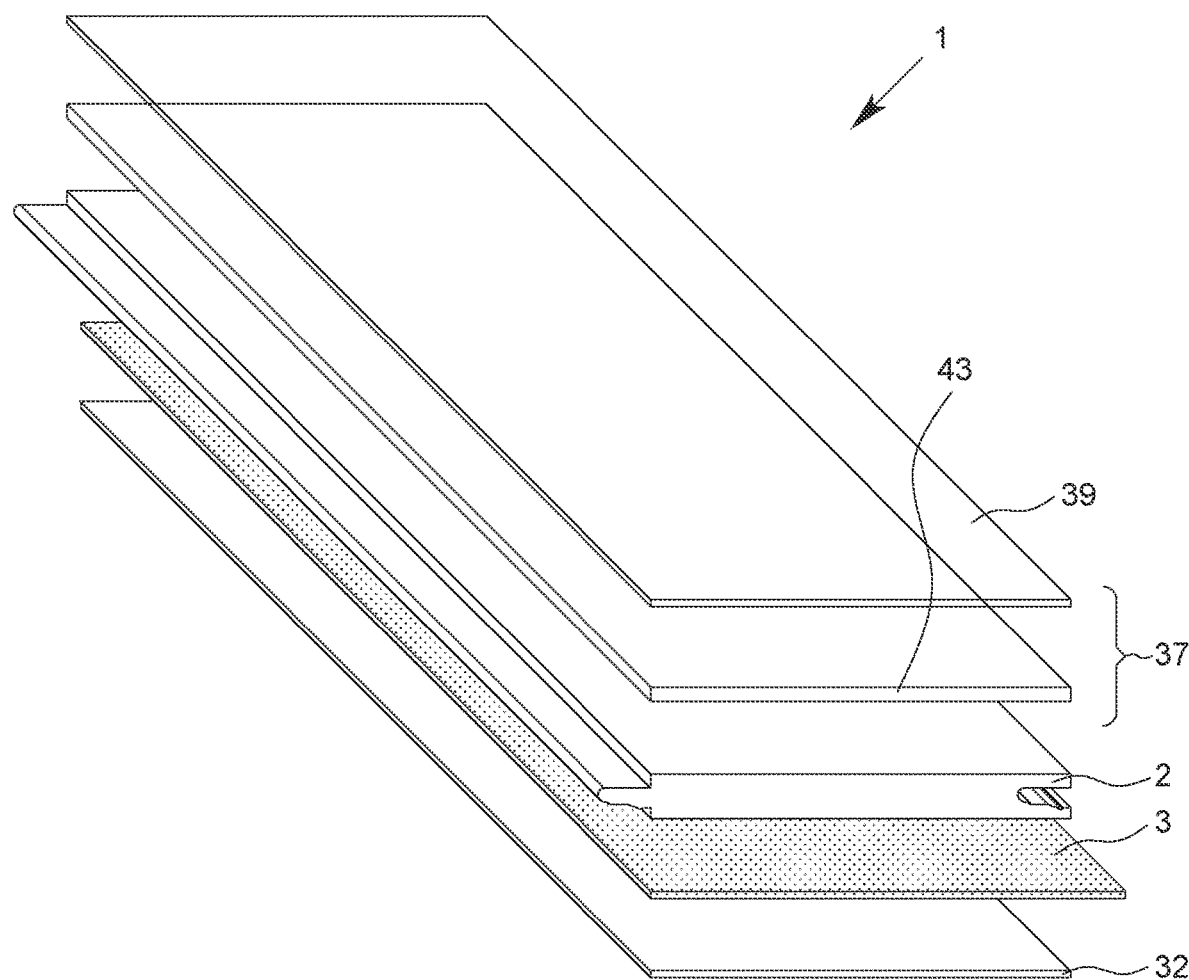
Figure 18:
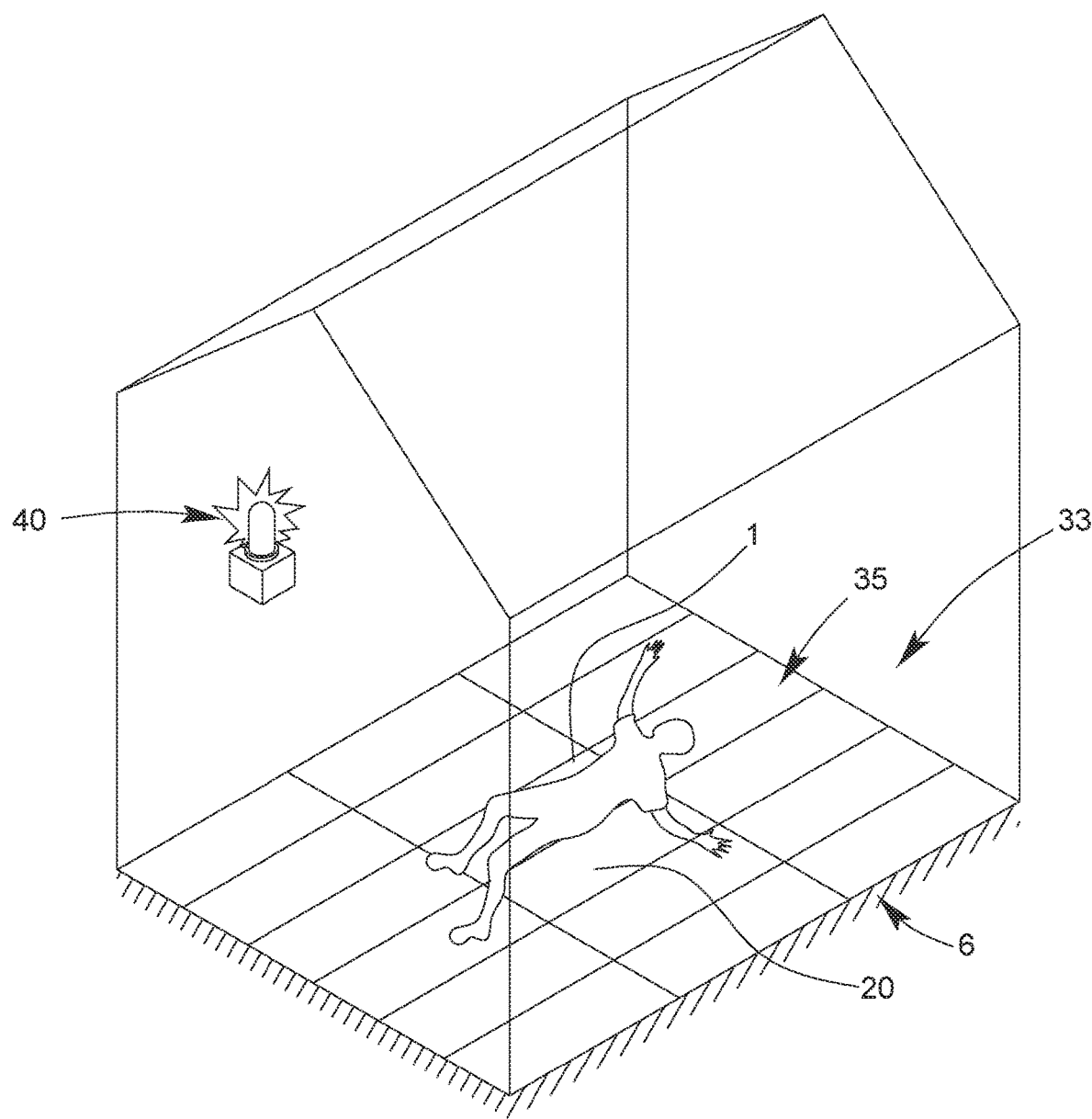
Figure 19:
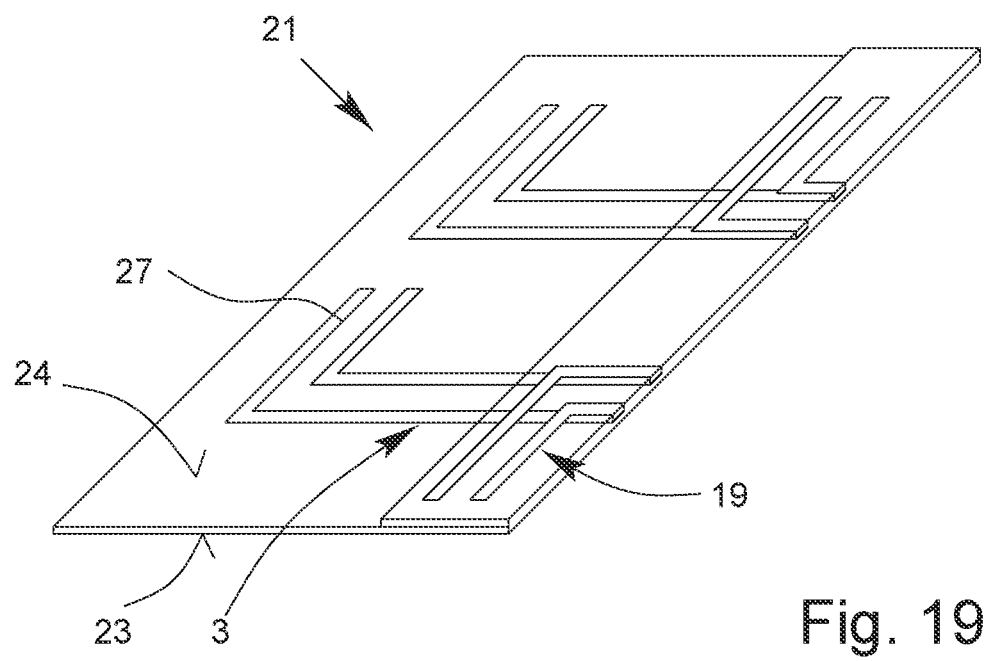
Figure 20:
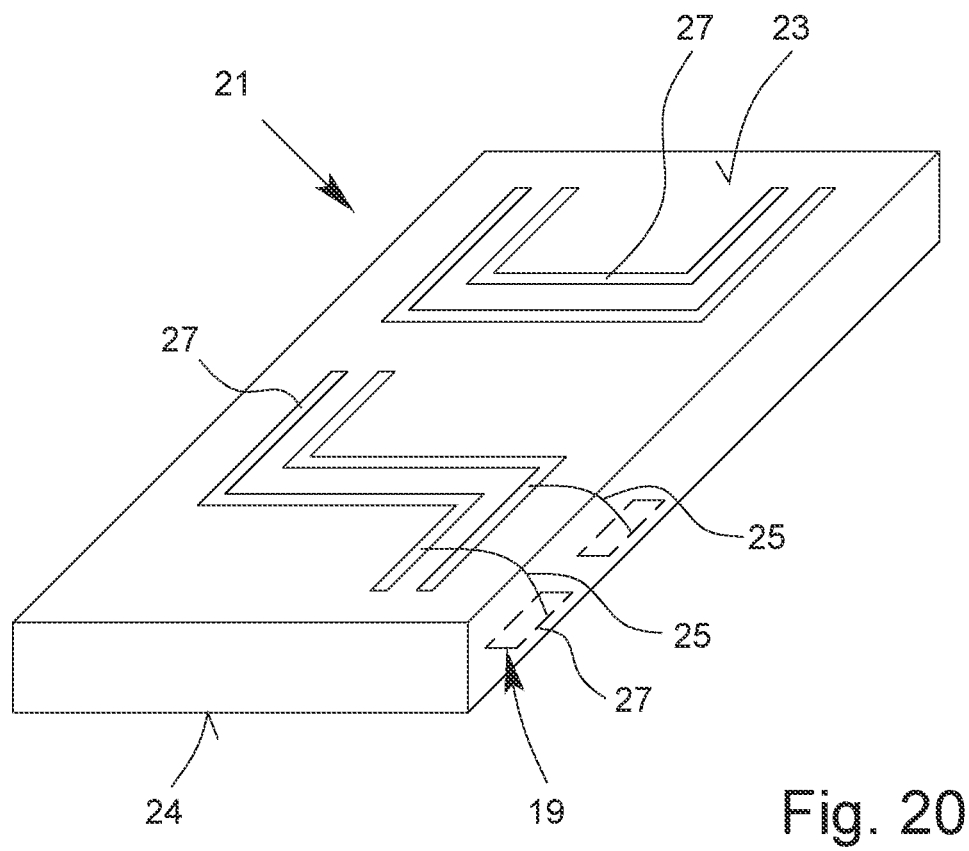
Figure 21:
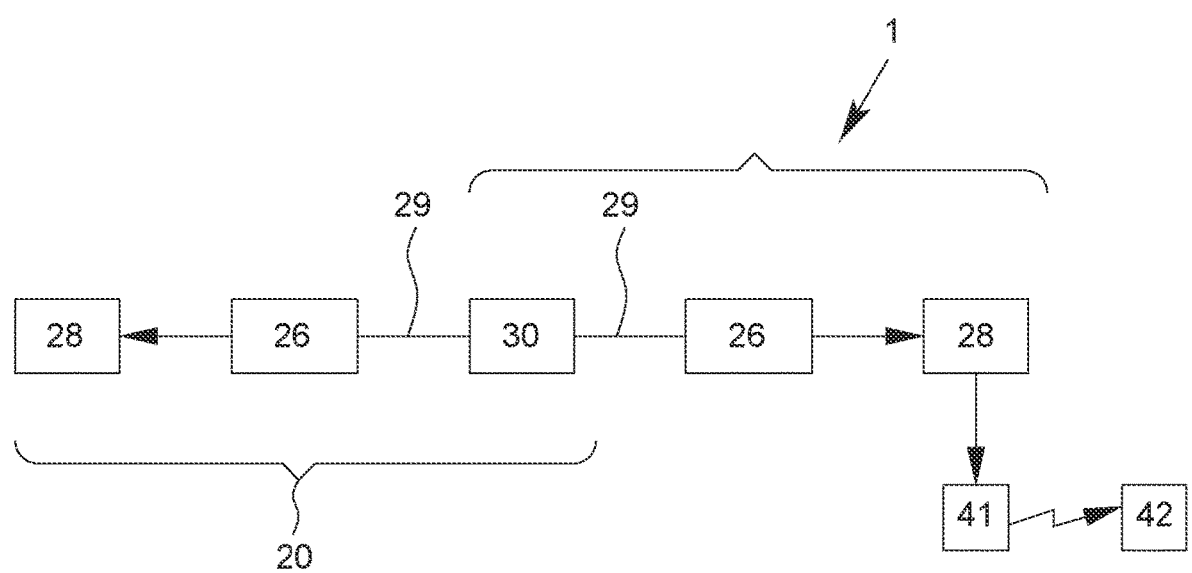
Figure 23:
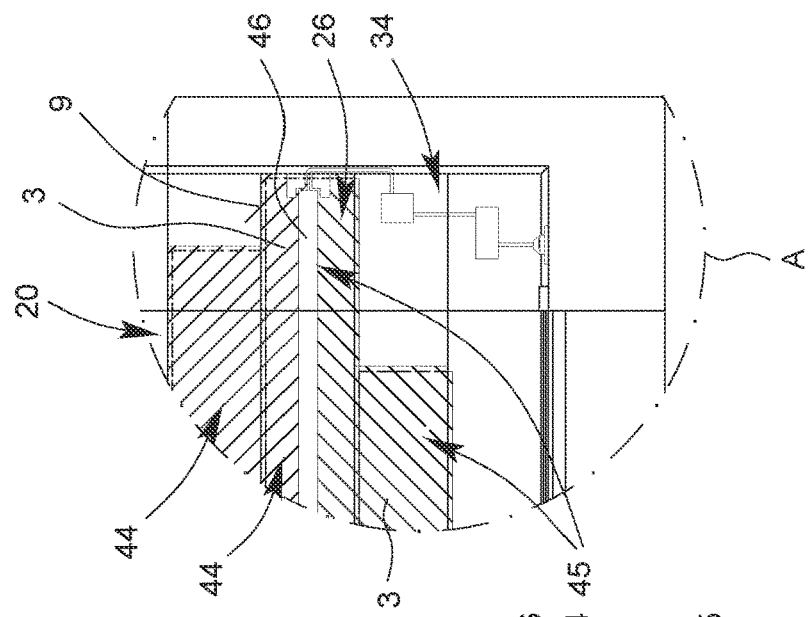
Figure 22:
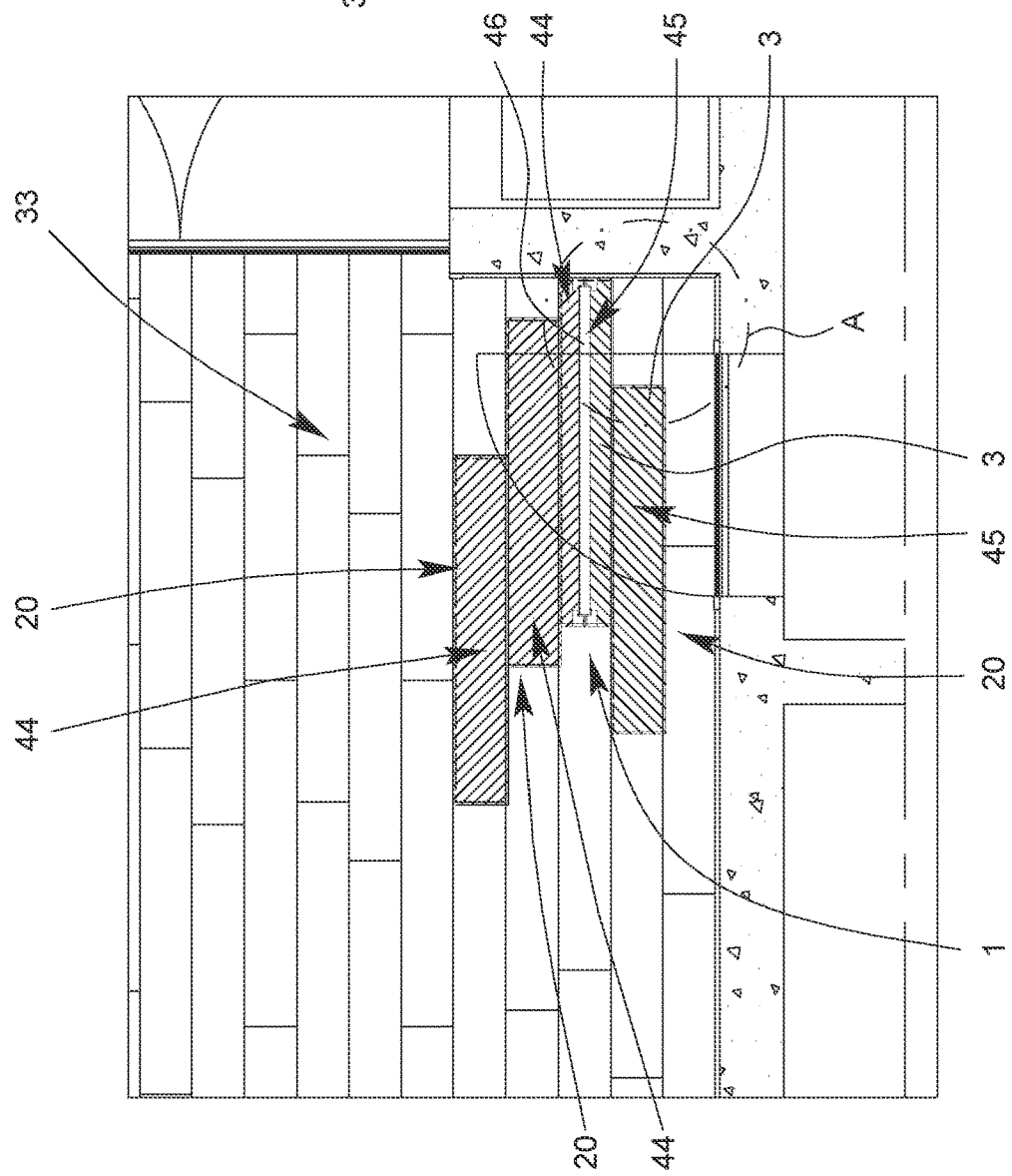
Figure 26:
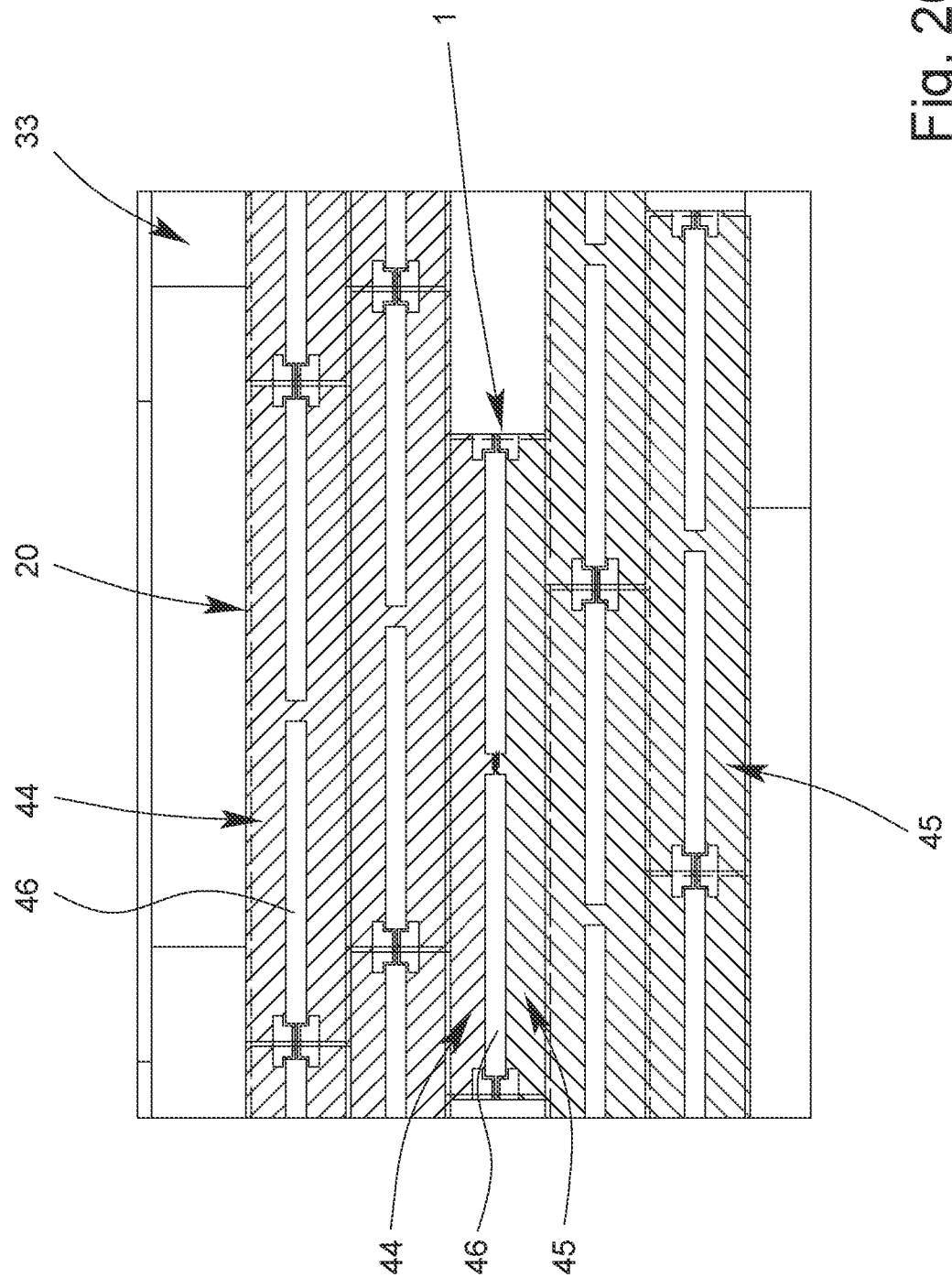

It shows:

FIG. 1 a schematic perspective view of a surface element according to the invention, FIG. 2 a schematic cross-sectional view of the surface element according to the invention shown in FIG. 1, FIG. 3 a schematic cross-sectional view of a further embodiment of the surface element according to the invention, FIG. 4 a schematic cross-sectional view of a further embodiment of a surface element according to the invention connected to a further surface element, FIG. 5 a schematic illustration of the system according to the invention, FIG. 6 a schematic top view of a coating according to the invention, FIG. 7 a schematic perspective illustration of surface elements according to the invention in accordance with a further embodiment, FIG. 8 a schematic perspective illustration of surface elements according to the invention in accordance with a further embodiment, FIG. 9 a schematic perspective illustration of surface elements according to the invention in accordance with a further embodiment, FIG. 10 a schematic perspective illustration of surface elements according to the invention in accordance with a further embodiment, FIG. 11 a schematic perspective illustration of surface elements according to the invention in accordance with a further embodiment, FIG. 12 a schematic perspective illustration of surface elements according to the invention in accordance with a further embodiment, FIG. 13 a schematic top view of the underside of a further embodiment of the surface element according to the invention connected to further surface elements, FIG. 14 a schematic top view of the underside of a further embodiment of the surface element according to the invention connected to further surface elements, FIG. 15 a schematic top view of the underside of a further embodiment of the surface element according to the invention connected to further surface elements, FIG. 16 a schematic perspective illustration of the layer structure of a further embodiment of the surface element according to the invention, FIG. 17 a schematic perspective illustration of the layer structure of a further embodiment of the surface element according to the invention, FIG. 18 a schematic perspective illustration of a further embodiment of the surface element according to the invention, FIG. 19 a schematic perspective illustration of the support layer according to the invention, FIG. 20 a schematic perspective illustration of a further embodiment of the support layer according to the invention, FIG. 21 a schematic illustration of a further embodiment of a surface element according to the invention connected to a further surface element, FIG. 22 a schematic illustration of a further embodiment of the system according to the invention, FIG. 23 a schematic view of detail A of FIG. 22, FIG. 24 a schematic illustration of the surface element according to the invention according to a further embodiment, FIG. 25 a schematic illustration of the surface element according to the invention in accordance with a further embodiment, FIG. 26 a schematic illustration of a further embodiment of the system according to the invention, FIG. 27 a schematic illustration of the surface element according to the invention in accordance with a further embodiment, and FIG. 28 a schematic illustration of the surface element according to the invention in accordance with a further embodiment.

FIG. 1 shows a surface element 1 and/or a floorboard intended for use as a floor, wall and ceiling surface element for a floor, wall and/or ceiling coating. The use of the surface element 1 in a coating 35 is illustrated, for example, in FIG. 18.

The surface element 1 comprises at least one carrier plate 2 and at least one functional layer 3.

The carrier plate 2 comprises a top side 5 facing a usable side 4 and an underside 7 opposite the top side 5 and facing the underground 6. In FIG. 18, it is shown schematically that the underground 6 is provided underneath the surface element 1.

The surface element 1 shown in FIG. 1 comprises the functional layer 3 below the carrier plate 2. The functional layer 3 thereby faces the underside 7 of the carrier plate 2.

It is also provided that the functional layer 3 is designed in such a way that it projects over the side edge 10 of the side 8 at least in some regions on at least one side 8 when the surface element 1 is installed. In FIG. 1, the side edge 10 is to be understood as the outermost edge of the surface element 1. FIG. 1 further shows that the functional layer 3 protrudes over the side edge 10 on only one long side 9 in the installed state. Especially it is provided that according to FIG. 1 the functional layer 3 does not project on at least one transverse side 12. It is not shown that the functional layer 3 does not project on any transverse side 12 of the surface element 1.

The functional layer 3 may be designed as a continuous layer, in particular as a single layer, and/or as a multi-part layer, especially at least two layers electrically connected to each other. The functional layer 3 may further comprise a plurality of spaced-apart projecting regions.

In FIG. 1, it is shown that the functional layer 3 is arranged directly against the carrier plate 2.

It is not shown that at least one further layer may be provided between the underside 7 of the carrier plate 2 and the functional layer 3.

Furthermore, it is apparent from FIG. 1 that corresponding tongue-and-groove joint geometries 11 are provided on opposite sides 8 of the carrier plate 2, especially both on the long sides 9 and on the transverse sides 12. In the embodiment shown, the tongue-and-groove joint geometries 11 serve to design a click connection. Via such a click connection, the surface element 1 can be connected to further surface elements 20.

It is not shown that corresponding push-button or bayonet locking connection geometries are provided on opposite sides 8 of the carrier plate 2.

FIGS. 1 and 2 show that the carrier plate 2 comprises a groove side 14 having a groove 13 and a tongue side 16 opposite the groove side 14 and comprising a tongue 15. Thereby, the groove side 14 and/or groove 13 is designed to correspond to the tongue side 16 and/or tongue 15, so that a click connection is created when the groove side 14 is connected to the tongue side 16, as can be seen in FIG. 4, for example.

Furthermore, it can be seen from FIG. 2 that the functional layer 3 protrudes over the side edge 10 of the groove side 14 in the installed state. FIG. 2 further shows that the functional layer 3 can terminate with the side edge 10 of the tongue side 16 and especially does not project beyond the side edge 10 of the tongue side 16.

FIG. 2 shows that the functional layer 3 projects with its protruding area 17 on the groove side 14 of the long side 9 in the installed state. The protruding area 17 comprises at least one contacting area 18 at least in some areas. The contacting area 18 is designed—as a function of the design of the surface element 1—to be electrically contacting and/or electrically conductive and/or inductively couplable.

Furthermore, FIG. 2 shows that on the side 8 opposite the contacting area 18, a further contacting area 19 is provided on the functional layer 3, at least in some areas. The further contacting area 19 can also be designed to be electrically contactable and/or electrically conductive and/or inductively couplable.

The contacting area 18 can be arranged on an underside of the functional layer 3 facing away from the underside 7 of the carrier plate 2. In particular, the contacting area 18 can be arranged on a top side of the functional layer 3 facing the underside 7 of the carrier plate 2. Finally, the further contacting area 19 is arranged in the area of the opposite longitudinal edge region of the functional layer 3.

Furthermore, FIG. 4 shows that the contacting area 18 and the further contacting area 19 are designed to correspond to one another in such a way that, in the installed state of the surface element 1, in which the surface element 1 is connected to at least one further surface element 20, the contacting area 18 of the surface element 1 is electrically conductively connected and/or inductively coupled to the further contacting area 19 of a further surface element 20 connected to the surface element 1. In particular, the contacting area 18 can be arranged at least in some areas directly on the further contacting area 19 of the further surface element 20 in the installed state, as shown in FIG. 20.

The design of the functional layers 3 of the surface element 1 and the further surface element 20 are shown schematically in FIG. 4 and in the following FIGS. 7 to 15. Especially in FIGS. 4 and 7 to 15, the support layer 21 and/or the functional layer 3 are shown schematically enlarged in order to actually better clarify the invention.

In the installed state, it can be provided that the protruding area 17, which comprises the contacting area 18 at least in some areas, is arranged below the further contacting area 19, facing the underground 6, wherein the further contacting area 19 of the further surface element 20 can be arranged above the protruding area 17 in the connected state. Essentially, the further surface element 20 can be pivoted into the groove side 14 of the surface element 1 via its tongue side 16, whereby the further contacting area 19 is arranged on and/or above the contacting area 18.

FIG. 4 shows that the contacting area 18 is arranged at least in regions directly adjacent to the further contacting area 19 of the further surface element 20 in the installed state. Via the arrangement of the contacting area 18 and the further contacting area 19, the surface element 1 and the further surface element 20 connected thereto are connected in an electrically conductive and/or inductively coupled manner.

It is further apparent from FIG. 4 that the contacting area 18 is arranged on the groove side 14 of the long side 9. The contacting area 18 and the further contacting area 19 of the further surface element 20 are arranged one above the other and/or one on top of the other, wherein the connection of the surface element 1 to the further surface element 20 also causes the contacting area 18 and the further contacting area 19 and/or the functional layer 3 of the further surface element 20 to be "pressed" onto one another with the protruding region 17 of the functional layer 3 of the surface element 1.

The support layer 21 can be arranged over the entire surface, as shown in FIG. 1, on the underside 7 of the carrier plate 2, at least indirectly. In further embodiments, as shown for example in FIG. 7, the support layer 21 may also be arranged at least regionally on an underside 7 of the carrier plate 2.

FIG. 7 shows that the functional layer 3 is arranged on a support layer 21. The functional layer 3 can be firmly bonded to the support layer 21. FIG. 3 again shows that the support layer 21 is formed from and/or consists of the functional layer 3.

In addition, FIG. 20 shows schematically that the further contacting area 19 is arranged on a side of the support layer 21 facing away from the carrier plate 2—namely the underside 24.

FIG. 19 shows that the support layer 21 is provided with the functional layer 3 on one side—namely on the top side 23.

FIG. 7 shows that the support layer 21 is folded in and/or folded over at least in sections on the tongue side. In the case of a folded-in and/or folded-over area 22 of the support layer 21, the result is an electrically conductive connection when the surface element 1 is arranged against a further surface element 20, as can be seen from FIG. 4.

The further contacting area 19 can be provided on the folded-in and/or folded-over area 22 of the carrier plate 21 facing away from the carrier plate 2, as illustrated in FIGS. 4 and 7.

As a function of the folding line and/or folding in the transition area and/or at the bend of the folded-in area 22, a restoring force of the folded-in area 22 caused in the installed state can be provided, which in addition to the gravitational force enables a better contact pressure and especially an improved electrical contact between the surface element 1 and the further surface element 20.

By folding over the support layer 21, a one-sided arrangement of the functional layer 3 on the support layer 21—as shown in FIG. 19—can be provided.

The functional layer 3 can be arranged on the support layer 21 on one side and/or on both sides. In the one-sided arrangement of the functional layer 3 shown in FIGS. 7 and 8, it is provided that the functional layer 3 is arranged on an underside 23 of the support layer 21 facing the underside 7 of the carrier plate 2. In FIGS. 7 to 12, the support layer 21 of the surface element 2 provided with the functional layer 3 is designed differently from that of the further surface element 20, in particular with regard to the arrangement and design of the electrical conductor paths 27.

In further embodiments not shown, it can be provided that the support layer 21 of the surface element 1 provided with the functional layer 3 and of the further surface element 20, which is connected to the surface element 1 in the installed state, are designed to be at least essentially identical in construction.

FIG. 20 shows schematically that the functional layer 3 of the top side 23 of the support layer 21 is connected to the functional layer 3 of the underside 24 of the support layer 21 by means of a connection means 25 in an electrically conductive and/or inductively coupled manner. In further embodiments not shown, rivets, staples and/or other connecting means may be provided as connecting means. Ultimately, the connecting means 25 enables electrical contacting of the two functional layers 3, each of which is arranged on one and/or on the same support layer 21.

It is not shown that the support layer 21 comprises an electrically conductive and/or an electrically insulating material at least in some areas. As electrically non-conductive material of the support layer 21, a plastic material and/or a material comprising and/or consisting of wood, paper, cardboard, cork, felt and/or glass may be provided. A metal-containing material, such as aluminum, copper, silver and/or gold, may be provided as a conductive material for the support layer. It is understood that alloys of the aforementioned metals are also readily possible. Insofar as the support layer 21 comprises an electrically conductive material at least in areas, the support layer 21 can form the functional layer 3 and/or a component of the functional layer 3 at least in these areas.

FIG. 8 shows schematic illustration that the functional layer 3 comprises at least one measuring device 26, which is arranged especially on a top side 24 of the support layer 21 facing the underside 7 of the carrier plate 2. The measuring device 26 can thereby be connected to conductor paths 27 of the functional layer 3.

The measuring device 26 shown schematically in FIG. 8 can be designed as a pressure sensor. Alternatively or additionally, the measuring device 26 may comprise and/or be formed from a capacitive sensor. In the embodiment shown in FIG. 1, it is provided that a capacitive sensor of the measuring device 26 extends over the entire surface of the functional layer 3, wherein the support layer 21 consists of the functional layer 3. In the case of a capacitive sensor, the entire surface of the functional layer 3 can ultimately serve to measure the change in capacitance. In the embodiment shown in FIG. 8, it is provided that the measuring device 26 comprises a pressure sensor which is connected to the conductor paths 27 of the functional layer 3, especially for power supply. When the functional layer 3 is designed as a capacitive sensor, it can be provided that the contacting area 18 extends over the entire protruding area 17 of the functional layer 3.

In the case of the measuring device 26, it can be provided that this is designed to detect the change in pressure or change in capacitance (capacitive sensor) acting on the surface element 1. In further embodiments not shown, it can be provided that the measuring device 26 is designed to determine the temperature and/or the humidity. In particular, the measuring device 26 can be firmly connected to the support layer 21.

Furthermore, in the embodiment of the capacitive sensor shown in FIG. 1, it is provided that it extends at least substantially over the entire surface of the support layer 21.

FIG. 18 shows a coating 35 that comprises at least one surface element 1 that is designed to detect the change in pressure acting on the surface element 1. For example, the surface element 1 can detect whether a person, especially a frail and/or morbid person, is lying on the floor (coating 35) for a longer time, for example for more than one minute. If necessary, this can lead to an alarm and/or signal being sent out, as can be seen schematically in FIG. 18.

FIG. 7 shows that at least two conductor paths 27 of the functional layer 3 are arranged on the support layer 21. FIG. 7 further shows that two pairs of conductor paths 27 of the functional layer 3 are arranged on the support layer 21 in each case. In FIGS. 13 to 15, it is shown that in each case one pair of conductor paths 27 of the surface element 1 corresponds to in each case one further pair of conductor paths 27 of a further surface element 20.

In FIG. 15, it is shown that the conductor paths 27 in at least one contacting area 18 and/or at least one further contacting area 19 are electrically insulated at least in some areas, so that an electrically insulated area 36 is available.

It is not shown that the electrical insulation can be caused by a lacquer. Especially, the electrically insulated area 36 is provided in the area(s) where otherwise—in case of overlapping with further conductive paths 27—a short circuit would occur.

In the case of the contacting of the conductor paths 27 shown in FIGS. 9, 10, 13 and 14, an electrically insulated area 36 is not necessarily provided, since no undesirable overlapping of the conductor paths 27 occurs and/or is available. Finally, when the surface element 1 is connected to the further surface element 20, it is provided that the respective conductor paths 27 are electrically connected to corresponding conductor paths 27.

In the case of the structurally identical design of the surface element 1 and the further surface element 20, which is not shown, it is especially provided that electrically insulated areas 36 are arranged on and/or at the functional layer 3. The electrically insulated areas 36 prevent a short circuit during the electrical connection of the surface element 1 and the further surface element 20.

FIG. 9 shows that the conductor paths 27 are arranged in at least one contacting area 18 and/or a further contacting area 19 in such a way that, in the installed state of the surfacing element 1, they are electrically conductively connected and/or inductively coupled to the respective conductor paths 27 of a further surfacing element 20 connected to the surfacing element 1. FIG. 9 further shows that the conductor paths 27 of the surface element 1 are arranged to overlap with the conductor paths 27 of the further surface element 20.

FIG. 10 shows that a processing device 28 is associated to the functional layer 3 and/or the measuring device 26. In the illustrated design example, it is shown schematically that the processing device 28 is designed as part of the functional layer 3 and is arranged especially directly adjacent to the support layer 21. The processing device 28 is designed to process the information recorded by the measuring device 26.

FIG. 21 shows schematically that the processing device 28 can transmit the information received and processed by the measuring device to a transmission device 41, which in turn can transmit the information, especially wirelessly, to an evaluation device 42. The evaluation device 42 may be associated to the surface element 1. However, it can be provided that the evaluation device 42 is not arranged within the layer structure of the surface element 1—i.e. externally.

Furthermore, FIGS. 10 and 21 show that the processing device 28 is designed with at least one information transmission path 29 for transmitting the information picked up by the measuring device 26, especially processed by the processing device 28. The information transmission path 29 can thereby be connected to the measuring device 26 and/or to the processing device 28. In the illustrated embodiment example, the information transmission path 29 is connected to the processing device 28.

The information recorded by the measuring device 26 can be transmitted via the information transmission path 29. At least one contacting area 31 and an information transmission interface 30 can be provided for transferring or forwarding the information from the surface element 1 to a further surface element 20. Thereby the information transmission interface 30 can be provided both at the surfacing element 1 and the further surface element 20. Furthermore, it can be provided that the information transmission interface 30 is part of both the surface element 1 and the further surface element 20, so that the information transmission interfaces 30 form the contacting area 31. Via the information transmission interface 30, the information can be transmitted from the surface element 1 to a further surface element 20 or vice versa.

It is not shown that the information can also be transmitted wirelessly via the information transmission interface 30, especially the information can be transmitted by radio, preferably via an antenna.

In the embodiment shown in FIG. 10, a pressure sensor is provided as the measuring device 26, which is connected in an electrically conductive manner to at least two conductor paths 27—in the embodiment shown, to four conductor paths 27. Furthermore, it can be provided that insulated areas 36 are also arranged on the information transmission path 29, especially in the area of overlap with the conductor paths 27 and/or further information transmission paths 29.

Furthermore, the conductor paths 27 can be designed with multiple poles and/or different poles. The width of the conductor paths 27, especially in the contacting area 18, in the contacting area 31 and/or in the further contacting area 19 can also vary. FIG. 15 shows, for example, that in the area of contacting area 18 the electrical conductor paths 27 comprise a greater thickness than the conductor paths 27 in the area of further contacting area 19, especially an increased and/or enlarged thickness or width of between 10% and 200%. This is advantageous in that a laying tolerance comprising a certain play is made possible during laying, at which the electrical contacting can nevertheless be adequately ensured.

It is not shown that the functional layer 3 comprises a printed circuit and/or is formed by a printed circuit.

Furthermore, it is not shown that the functional layer 3 is printed directly on the support layer 21. For example, digital printing, screen printing and/or web offset printing may be provided as printing. In particular, the material for the functional layer 3 can be a conductive material that can be applied by printing, especially an ink material comprising silver pigments.

Furthermore, it is not shown that the support layer 21 is designed with its top side 23 facing the carrier plate 2 as a separate layer for connection to a further layer of the surface element 1, especially the carrier plate 2. It can thereby be provided that the top side 23 and/or the underside 24 of the support layer 21 is designed as an adhesive film, at least in certain areas. Especially the support layer 21 can be designed as an adhesive layer and/or adhesive film.

FIGS. 16 and 17 show that at least one layer structure is arranged on the top side 5 of the carrier plate 2. In the illustrated embodiment examples, a multilayer layering 37 is provided. The multi-layered layered structure 37 may be firmly connected to the carrier plate 2.

In the embodiment example shown in FIG. 16, the design of the surface element 1 is provided as a parquet surface element. In the embodiment example shown in FIG. 17, the design of the surface element 1 is provided as a laminate surface element.

FIG. 16 shows that the multilayer layering 37 comprises at least one real wood top layer 38. In turn, FIG. 17 provides that the multilayer layering 37 comprises a decorative layer 43, especially a decorative foil.

In addition, the multilayer layering 37 may comprise a protective layer 39, wherein the protective layer 39 may be designed as an overlay 39 and as a wear layer comprising corundum particles in particular. The wear layer 39 may be designed to protect the real wood top layer 38 and/or the decorative layer 43.

A countermove 32 may be arranged below the carrier plate 2. The countermove 32 faces the underside 7 of the carrier plate 2. In the embodiment example shown in FIG. 17, a kraft paper is provided as the countermove 32. As shown in FIG. 17, the functional layer 3 can be arranged between the countermove 32 and the carrier plate 2, preferably directly adjacent to the carrier plate 2.

It is not shown that the functional layer 3 can also be arranged below the countermove 32 and/or that the support layer 21 and/or the functional layer 3 can form the countermove 32.

Further not shown is that the layered structure of the surface element 1 comprises a damping layer. The damping layer may face the underside 7 of the carrier plate 2.

Preferably, the damping layer may be arranged on the countermove 32. The damping layer may comprise a film layer comprising plastic and/or a layer comprising foam. Furthermore, it is alternatively or additionally possible that the damping layer is designed as a support layer 21 and/or that the functional layer 3 and/or the support layer 21 is/are firmly, preferably directly, connected to the damping layer.

Furthermore, it is not shown that the carrier plate 2 can be designed as an HDF plate, real wood layer and/or MDF plate.

FIG. 5 shows a system 33 comprising a plurality of surface elements 1. At least one surface element 1 is designed according to at least one of the embodiments described earlier. The surfacing element 1 may be connected to further surface elements 20 to form a coating 35. The coating 35 formed in this way is shown schematically in FIG. 6, for example.

The further surface elements 20 may comprise a measuring device 26 and/or be provided for transmitting information picked up by the measuring device 26 of the surface element 1 and/or for transmitting energy.

In addition, FIG. 5 shows that an energy supply device 34, preferably external, is associated to the functional layer 3 of the surface element 1. The power supply device 34 need not thereby be part of the surface element 1. The power supply device 34 can supply the functional layer 3 and/or the surface element 1 with power, wherein the power supply device 34 can be electrically conductive and/or inductively coupled to the functional layer 3.

Eventually, it can be provided in the system 33 that the power supply device 34 is associated to a surface element 1. The further surface element 20 need not be connected to and/or comprise a power supply device 34. In the case of a coating 35 formed by the surface element 1 and the further surface element 20, it is especially sufficient if only one surface element 1 is connected to the energy supply device 34 and/or the latter is associated to the surface element 1.

The surface element 1 associated with the power supply device 34 may be referred to as a "connection floorboard". A "conductor floorboard" can be formed by the further surface element 20, which can be formed for transmitting electrical energy and/or electrical charge and/or information.

Insofar as the surface element 1 comprises a pressure sensor of the measuring device 26, it is provided—as explained above—that conductor paths 27 are arranged on the support layer 21. In the system 33, a connection is thus provided between the conductor paths 27 of the surface element 1 and the conductor paths 27 of the further surface elements 20, as shown schematically in FIGS. 7 to 15.

It is not shown that at least one, in particular external, operating device for controlling the functional layer 3 and/or for controlling the measuring device 26 is associated to the functional layer 3.

Furthermore, it is not shown that a control device, especially an external one, is associated to the functional layer 3, the measuring device 26 and/or the processing device 28. The functional layer 3, the measuring device 26 and/or the processing device 28 can be designed to be controllable and/or regulatable by the control device.

Furthermore, it is not shown that a negative mask layer is associated to the functional layer 3 for compensating protruding contours.

FIG. 18 also shows a system 33, wherein at least one surface element 1 is connected to a control device 40. A signal, especially an acoustic and/or visual signal, can be emitted via the control device 40. This signal can be emitted, for example, at the time when a person has fallen on the usable side 4 of the coating 35 and/or when a person steps on the surface element 1 comprising the measuring device 26.

FIG. 22 shows a system 33 that comprises a surface element 1 ("connection floorboard") and further surface elements 20 ("conduction floorboards"). It is schematically indicated that the surface element 1 is used as part of a floor covering 35. The surface element 1 and/or the functional layer 3 of the surface element 1 comprises a capacitive sensor of the measuring device 26. In the embodiment example shown, the functional layer 3 of the surface element 2 comprises at least two electrically charged areas—represented by corresponding hatchings—which together—at least indirectly—cover at least substantially the entire underside 7 of the carrier plate 2.

The electrically positively charged area 44 of the functional layer 3 is electrically separated from the electrically negatively charged area 45 of the functional layer by an insulating separating area 46.

The further surface element 20 comprises either a positively charged region 44 or a negatively charged region 45 as a functional layer 3—depending on which region of the functional layer 3 of the surface element 1 the further surface element 20 is arranged. In the illustrated embodiment example, it is provided that the electrically positively charged area 44 and the electrically negatively charged area 45 are adjacent to one long side 9 in each case.

FIG. 23 shows detail A from FIG. 22. An energy supply device 34, especially a power supply unit, is arranged on the surface element 1 and especially on the functional layer 3 of the surface element 1, which supplies the surface element 1 with a positive or negative electrical charge. This charge can then be passed on to the further surface elements 20 ("conductor floorboards").

FIGS. 24 and 25 concern an embodiment in which the measuring device 26 of the functional layer 3 comprises a capacitive sensor. Essentially, in the embodiments shown, the sensor surface of the capacitive sensor extends at least substantially over the entire surface of the functional layer 3. In FIG. 24, at least two electrically insulating separating areas 46 are provided. In the embodiment example shown, the separating areas 46 are designed to be at least substantially rectangular.

The surface element 1 shown in FIG. 24 can be used especially as a further surface element 20 in a system 33, wherein no power supply device 34 needs to be arranged on the further surface element 20. Eventually, the surfacing element 1 shown in FIG. 24 represents a "conductor floorboard" that can be used as a further surface element 20 in a system 33.

FIG. 25 shows a modification of the surface element 1 shown in FIG. 24, wherein the two electrically insulating separating areas 46 have been combined to form an electrically insulating separating area 46. In the embodiment shown, a narrow web connecting the separating areas 46 is provided. The surface element 1 shown in FIG. 25 can be used in a system 33 as a surface element 1 that can actually form a "connection floorboard". The separating area 46 of the surface element 1 shown in FIG. 25 is designed in such a way that two differently electrically charged areas of the functional layer 3 can be electrically separated from each other. The electrically insulating "web" can be provided, for example, by a knife, in particular a cutter knife, in the functional layer 3, in particular wherein at least part of the functional layer 3 is removed. These embodiments are particularly advantageous, since "connection floorboards" (surface elements 1) and "conduction floorboards" (further surface elements 20) used in a system 33 can thus be produced and stored uniformly.

FIG. 26 shows the surface elements 1 shown in FIGS. 24 and 25 in a system 33, wherein the surface element 1 shown in FIG. 24 is used as a further surface element 20 ("conduction floorboard") and the surface element 1 shown in FIG. 25 is used as a surface element 1 ("connection floorboard"). The surface element 1 comprises an electrically positively charged area 44 of the functional layer 3 and an electrically negatively charged area 45 of the functional layer 3. The surface element 1 is connected to a power supply device 34, which is not shown.

Positively and negatively charged regions 44, 45 of the further surface elements 20 are arranged on the positively and negatively charged regions 44, 45, respectively. The further surface elements 20 comprise either only one positively charged region 44, 45 or one negatively charged region 44, 45. The electrically charged regions 44, 45 are finally designed over their entire surface as sensor surfaces of a capacitive sensor of the measuring device 26.

FIG. 27 schematically shows a surface element 1 which comprises a functional layer 3 which is arranged at least substantially over the entire surface on the underside 7 of the carrier plate 2—at least indirectly. The functional layer 3 comprises a measuring device 26, which in turn comprises a capacitive sensor in the illustrated example. The sensor area of the capacitive sensor extends at least substantially over the entire functional layer 3. The sensor area is formed by an electrically positively charged area 44 and an electrically negatively charged area 45, which finally make up the measuring device 26 of the functional layer 3. The electrically charged areas 44, 45 are electrically separated from each other by an electrically insulating separating area 46. It is schematically shown that a person enters the surface element 1.

FIG. 28 schematically shows a further embodiment of the capacitive sensor of the measuring device 26 of the functional layer 3. The functional layer 3 comprises an electrically positively charged area 44 and an electrically negatively charged area 45, which are electrically separated from one another by an at least essentially linear and wave-shaped and/or step-shaped separating area 46. This allows that when a person steps on the surface element 1, the person's foot encounters both a positively charged area 44 and an electrically negatively charged area 45. The change in capacitance thus exerted can be detected by the measuring device 26.

Schematically, in FIGS. 24 to 27, the groove side 14 and the tongue side 16 are shown by an "offset" of the top side and the underside of the surface element 1.

Not shown is that if the measuring device 26 comprises a capacitive sensor, the functional layer 3 may comprise electrically neutral surfaces. Alternatively or additionally, only one electrically charged area (positive or negative) may be provided, which may cooperate with another electrically charged area or region of the evaluation device 42 to detect a change in capacitance. In this context, it may be provided that within a system 33 the surface element 1 comprising the capacitive sensor comprises only one electrically positively or negatively charged functional layer 3 or sensor area.

Not shown is that a method for producing a surface element 1 according to one of the embodiments described earlier is provided. The method comprises the following steps:

A) providing a tongue-and-groove joint geometry 11 in a carrier plate 2, especially for designing a click connection;

B) applying a functional layer 3 on the underside of the carrier plate 2, wherein the functional layer 3 is arranged on the carrier plate 2 in such a way that the functional layer 3 projects on at least one side 8, in particular on at least one long side 9, beyond the side edge 10 of the side 8, in particular of the long side 9, in the installed state of the surface element 1;

wherein the method step B) is carried out subsequently to the method step A).

In the method not shown, it can be provided that at least one, especially multilayer layering 37 is arranged on the top side of the carrier plate 2 before the method step A) or after the method step A), especially before the method step B) is carried out. The layered structure 37 can be firmly connected to the carrier plate 2. The layered structure 37 may thereby comprise a wear layer, a decorative layer 43 and/or a cover layer.

The multilayer layering 37 and/or the layers of the multilayer layering 37 can especially be laminated to the carrier plate 2. Alternatively or additionally, it may be provided that a real wood top layer 38 is protected by a protective layer and/or sealant which is applied to the top side of the real wood top layer 38.

Alternatively or additionally, it may also be provided that the layered structure 37 is pressed to the carrier plate 2.

Especially, the process step B) is carried out after the laminating and/or pressing of the layered structure 37 and the carrier plate 2.

In a further embodiment of the method not shown, the tongue-and-groove joint geometries 11 are milled, stamped and/or cut into the sides 8 of the surface element 1, especially of the carrier plate 2.

In addition, in a further embodiment of the method not shown, following the method step B), the functional layer 3 can be folded downwards and/or folded over at least in sections on at least one side edge 10, in particular on a tongue side 16, i.e. facing away from the carrier plate 2.

Furthermore, it is not shown that before process step B) or after process step B) has been carried out, at least one recess, in particular a milled recess, is provided in the underside of the carrier plate 2. The recess can be cut, milled and/or stamped into the carrier plate 2. In addition, the recess can be provided to accommodate an electronic component.

LIST OF REFERENCE SIGNS

1 Surface element
2 Carrier plate

3 Functional layer
4 Usable side
5 Top side
6 Underground
7 Underside
8 Side
9 Long side
10 Side edge
11 Tongue and groove joint geometries
12 Transverse side
13 Groove
14 Groove side
15 Tongue
16 Tongue side
17 Protruding area
18 Contacting area
19 Further contacting area
20 Further surface element
21 Support layer
22 Folded-in and/or folded-over area
23 Top side of 21
24 Underside of 21
25 Connecting means
26 Measuring device
27 Conductor path
28 Processing device
29 Information transmission path
30 Information transmission interface
31 Contacting area
32 Countermove
33 System
34 Power supply device
35 Coating
36 Insulated area
37 Multilayer layering
38 Real wood top layer
39 Protective layer
40 Control device
41 Transmission device
42 Evaluation device
43 Decorative layer
44 Electrically positively charged area of 3
45 Electrically negatively charged area of 3
46 Separating area

The invention claimed is:

1. A surface element configured for use as a floor, wall or ceiling surface element for a floor, wall and/or ceiling covering, respectively, comprising:
at least one carrier plate and at least one functional layer, wherein the carrier plate comprises a top side facing a usable side and an underside opposite the top side and facing the underground,
wherein
the at least one functional layer is provided underneath the carrier plate, and the at least one functional layer is configured so that, in an installed state, the at least one functional layer projects beyond a side edge of at least one side, and wherein at least two conductor paths of the at least one functional layer are arranged on a support layer, wherein the support layer comprises conductor paths on one or both sides.

2. The surface element according to claim 1, wherein on opposite sides of the carrier plate corresponding tongue-and-groove joint geometries are provided with a groove side comprising a groove and a tongue side opposite the groove side comprising a tongue, wherein the at least one functional layer projects beyond the side edge of the groove side in the installed state and/or in that corresponding snap fastener and/or bayonet connection geometries are provided on opposite sides of the carrier plate.

3. The surface elements according to claim 1, wherein the at least one functional layer in a region projecting in the installed state comprises, at least in some regions, at least one contacting area which is configured to be electrically contacting and/or electrically conductive and/or couplable inductively, and/or in that the at least one functional layer on a side opposite the contacting area comprises a further contacting area which is configured to be electrically contacting and/or electrically conductive and/or couplable inductively.

4. The surface element according to claim 3, wherein the contacting area and the further contacting area are configured to correspond to one another in such a way that, in the installed state, the contacting area of the surface element is connected electrically conductive and/or is inductively coupled to a further contacting area of a further surface element connected to the surface element and wherein, the contacting area is arranged at least in regions directly adjacent to the further contacting area of the further surface element in the installed state.

5. The surface element according to claim 1, wherein the at least one functional layer is arranged on the support layer, or connected to the support layer, and/or that the at least one functional layer consists of the support layer.

6. The surface element according to claim 3, wherein the further contacting area is arranged on an underside of the support layer facing away from the carrier plate.

7. The surface element according to claim 3, wherein the support layer is folded in and/or folded over at least in sections on the tongue side, wherein the further contacting area is provided on the folded-in and/or folded-over area of the support layer facing away from the carrier plate.

8. The surface element according to claim 1, wherein the at least one functional layer is provided on the support layer on one side, on the top side of the support layer facing the carrier plate, or on both sides, wherein, when the at least one functional layer is arranged on both sides of the support layer, the at least one functional layer of the top side of the support layer is connected to the at least one functional layer of the underside of the support layer by means of a connecting means in an electrically conductive and/or inductively coupled manner.

9. The surface element according to claim 1, wherein the support layer comprises, at least in regions, an electrically conductive and/or an electrically insulating material.

10. The surface element according to claim 1, wherein at least one measuring device, sensor, pressure sensor, and/or capacitive sensor of the at least one functional layer, is arranged, or printed, on the support layer, wherein the measuring device, the sensor, the pressure sensor, and/or the capacitive sensor is firmly connected to the support layer and/or wherein the measuring device, the sensor, the pressure sensor, and/or the capacitive sensor is configured to detect a change in pressure and/or a change in capacitance acting on the surface element and/or is configured to determine the temperature and/or the humidity.

11. The surface element according to claim 1, wherein the conductor paths in at least one contacting area and/or in at least one further contacting area, are electrically insulated at least in regions.

12. The surface element according to claim 1, wherein the conductor paths are arranged in at least one contacting area and/or in at least one further contacting area in such a way that, in an installed state of the surface element, they are electrically insulated, at least in certain areas, that in the installed state of the surface element they are electrically conductively connected and/or inductively coupled to the respective conductor paths of a further surface element connected to the surface element, wherein the conductor paths of the surface element are arranged to overlap with the conductor paths of the further surface element.

13. The surface element according to claim 1, wherein a processing device is associated with the at least one functional layer and/or the measuring device, wherein the processing device is configured to process the information received from the measuring device.

14. The surface element according to claim 13, wherein the measuring device and/or the processing device is connected to at least one information transmission path configured to transmit the information picked up by the measuring device, wherein at least one information transmission interface is arranged in at least one contacting area, and configured so that the information can be transmitted to a further surface element via the information transmission interface and/or wherein the information can be transmitted wirelessly via the information transmission interface.

15. The surface element according to claim 1, wherein a countermove or a kraft paper, is arranged facing the underside of the carrier plate, wherein the at least one functional layer is arranged between the countermove and the carrier plate or directly on the carrier plate, and/or below the countermove, and/or wherein the at least one functional layer forms the countermove.

16. A system with a plurality of surface elements, wherein at least one surface element is formed according to claim 1, wherein, the surface element is connected to further surface elements to form a coating.

17. The surface according to claim 16, wherein the at least one functional layer is associated with a power supply device, wherein the power supply device is configured to supply the at least one functional layer with power, wherein the power supply device is electrically conductively connected to the at least one functional layer and/or inductively coupled to the at least one functional layer.

18. A method to produce a surface element, wherein the method comprises:
A) providing a tongue-and-groove joint geometry in a carrier plate, which is configured for providing a click connection;
B) applying a functional layer on an underside of the carrier plate, wherein the functional layer is arranged on the carrier plate in such a way that the functional layer projects on at least one side, beyond the side edge of the side, in the installed state of the surface element;
wherein process step B) is carried out after process step A), and wherein at least two conductor paths of the functional layer are arranged on a support layer, wherein the support layer comprises conductor paths on one or both sides.

\* \* \* \* \*